US007816176B2

(12) United States Patent
Sasaki et al.

(10) Patent No.: US 7,816,176 B2
(45) Date of Patent: *Oct. 19, 2010

(54) METHOD OF MANUFACTURING ELECTRONIC COMPONENT PACKAGE

(75) Inventors: Yoshitaka Sasaki, Milpitas, CA (US); Tatsushi Shimizu, Hong Kong (CN)

(73) Assignees: Headway Technologies, Inc., Milpitas, CA (US); SAE Magnetics (H.K.) Ltd., Shatin, N.T. (CN)

( * ) Notice: Subject to any disclaimer, the term of this patent is extended or adjusted under 35 U.S.C. 154(b) by 263 days.

This patent is subject to a terminal disclaimer.

(21) Appl. No.: 11/806,047

(22) Filed: May 29, 2007

(65) Prior Publication Data

US 2008/0295328 A1    Dec. 4, 2008

(51) Int. Cl.
*H01L 21/00*    (2006.01)
*H05K 1/02*    (2006.01)
(52) U.S. Cl. .......................................... 438/106; 29/843
(58) Field of Classification Search ................ 438/113, 438/107, 106, 406; 29/592.1, 846, 835, 831, 29/841, 843; 257/693, 696
See application file for complete search history.

(56) References Cited

U.S. PATENT DOCUMENTS 3,489,952 A * 1/1970 Hinchey ..................... 361/704

5,926,380 A    7/1999 Kim
6,746,897 B2 *  6/2004 Fukutomi et al. ........... 438/110
2003/0207495 A1 * 11/2003 Akram ....................... 438/108

FOREIGN PATENT DOCUMENTS

JP    A-2001-035993    2/2001
JP    A-2001-244403    9/2001

OTHER PUBLICATIONS

U.S. Appl. No. 11/706,367, filed on Feb. 15, 2007 in the name of Yoshitaka Sasaki et al.

* cited by examiner

*Primary Examiner*—Thomas L Dickey
*Assistant Examiner*—Nikolay Yushin
(74) *Attorney, Agent, or Firm*—Oliff & Berridge, PLC

(57) ABSTRACT

In a method of manufacturing an electronic component package, first, a plurality of sets of external connecting terminals corresponding to a plurality of electronic component packages are formed by plating on a top surface of a substrate to thereby fabricate a wafer. The wafer includes a plurality of pre-base portions that will be separated from one another later to become bases of the respective electronic component packages. Next, at least one electronic component chip is bonded to each of the pre-base portions of the wafer. Next, electrodes of the electronic component chip are connected to the external connecting terminals. Next, the electronic component chip is sealed. Next, the wafer is cut so that the pre-base portions are separated from one another and the plurality of bases are thereby formed.

23 Claims, 18 Drawing Sheets

METHOD OF MANUFACTURING ELECTRONIC COMPONENT PACKAGE

BACKGROUND OF THE INVENTION

1. Field of the Invention

The present invention relates to a method of manufacturing an electronic component package including at least one chip and a plurality of external connecting terminals, a method of manufacturing a wafer used for manufacturing the electronic component package, and a method of manufacturing a substructure used for manufacturing the electronic component package.

2. Description of the Related Art

A reduction in weight and an improvement in performance have been desired for mobile apparatuses represented by cellular phones and notebook personal computers. Higher integration of electronic components used for mobile apparatuses have been sought, accordingly.

A system large-scale integrated circuit (LSI) and a multi-chip module have been known as highly integrated electronic components. The system LSI is a single integrated circuit (IC) in which functions of various electronic components are incorporated. The multi-chip module is a module made up of a plurality of chips integrated through the use of a wiring substrate, for example.

The system LSI has a benefit that it allows the integration density to be higher and the number of leads to be minimized. On the other hand, the multi-chip module has a benefit that it facilitates the implementation of a single module having desired functions by integrating a plurality of chips having different functions.

A description will now be given of a conventional method of manufacturing an electronic component package including at least one chip and a plurality of external connecting terminals, such as a system LSI or a multi-chip module. In a typical conventional method of manufacturing an electronic component package, at least one chip is mounted on a base such as a wiring substrate prepared for a single electronic component package, a terminal of the chip is connected to an external connecting terminal, and the connecting portion between the terminal of the chip and the external connecting terminal is sealed. The connection between the terminal of the chip and the external connecting terminal is performed by wire bonding or flip-chip, for example. In a case in which flip-chip is employed, the terminal of the chip and the external connecting terminal are connected to each other through a lead inside the wiring substrate. Wiring among chips in the multi-chip module is also performed by wire bonding or flip-chip, for example.

JP 2001-035993A discloses a multi-chip module in which a bonding pad connected to a chip is connected to a lead that is an external connecting terminal by wire bonding. JP 2001-035993A further discloses a technique of forming inter-chip wiring and the bonding pad through a wire-forming process. According to this publication, the wire-forming process includes a film forming step, a lithography step and an etching step, for example.

JP 2001-244403A discloses a technique wherein inter-chip wiring and pads for external connection of a multi-chip module are formed through a wafer process. According to this publication, the wafer process includes a series of steps of forming an insulating layer, forming via holes, embedding plug metals, flattening, forming films by sputtering, and forming a wiring pattern through photolithography techniques.

U.S. Pat. No. 5,926,380 discloses a method of manufacturing a chip-size semiconductor package as will now be described. In this method, first, a lead frame is bonded to the top surface of a wafer in which a plurality of semiconductor chips each having a plurality of pads on the surface thereof and aligned with chip partition lines are formed. Next, leads of the lead frame and the pads of the semiconductor chips are connected to each other by wire bonding. Next, the top surfaces of the leads closer to the base ends are exposed and the top and bottom surfaces of the wafer are molded. Next, conductive metallic plating is performed on the exposed top surfaces of the leads closer to the base ends. Next, the wafer and the lead frame are cut to complete the semiconductor packages.

In the typical conventional method of manufacturing an electronic component package, a series of steps, such as mounting of at least one chip on the base, connection of the terminals of the chip to external connecting terminals, and sealing of the connecting portions between the terminals of the chip and the external connecting terminals, are performed for each electronic component package. This typical method has a problem that it is difficult to mass-produce electronic component packages at low costs in a short period of time.

The method of manufacturing a chip-size semiconductor package disclosed in U.S. Pat. No. 5,926,380 makes it possible to mass-produce chip-size semiconductor packages at low costs. In this method, however, to alter the specifications of semiconductor chips, it is required to start with design of a wafer including a plurality of semiconductor chips. Therefore, the method has a problem that it is difficult to respond to alterations to the specifications flexibly and quickly. In addition, it is impossible to manufacture multi-chip modules through this method.

OBJECT AND SUMMARY OF THE INVENTION

It is an object of the invention to provide a method of manufacturing an electronic component package, the method enabling mass production of electronic component packages at low costs in a short period of time and making it possible to respond to alterations to specifications flexibly and quickly, and to provide a method of manufacturing a wafer used for manufacturing the electronic component packages, and a method of manufacturing a substructure used for manufacturing the electronic component packages.

An electronic component package manufactured through a method of manufacturing an electronic component package of the invention incorporates: a base incorporating a plurality of external connecting terminals; and at least one electronic component chip that is bonded to the base and electrically connected to at least one of the external connecting terminals.

The method of manufacturing an electronic component package of the invention includes the steps of: fabricating a wafer, the wafer incorporating: a substrate having a top surface; and a plurality of sets of external connecting terminals that correspond to a plurality of electronic component packages and that are provided on the top surface of the substrate, the wafer including a plurality of pre-base portions that will be separated from one another later so that each of them will thereby become the base; bonding at least one electronic component chip to each of the pre-base portions of the wafer; and cutting the wafer so that the pre-base portions are separated from one another and a plurality of bases are thereby formed, the step of cutting the wafer being performed after the step of bonding the at least one electronic component chip to each of the pre-base portions. The step of fabricating the wafer includes the step of forming the plurality of sets of external connecting terminals on the top surface of the substrate by plating.

In the method of manufacturing an electronic component package of the invention, the wafer may further incorporate a plurality of chip bonding conductor layers to each of which the at least one electronic component chip is to be bonded, the plurality of chip bonding conductor layers being disposed on the top surface of the substrate.

In the method of manufacturing an electronic component package the invention, the step of forming the plurality of sets of external connecting terminals may include: the step of forming a plurality of first plating layers by plating, the plurality of first plating layers being to become portions of the respective external connecting terminals; and the step of forming a plurality of second plating layers by plating such that the second plating layers are respectively disposed on the first plating layers. In the step of forming the plurality of first plating layers, a plurality of chip bonding plating layers that are to constitute the plurality of chip bonding conductor layers may be formed at the same time.

In the method of manufacturing an electronic component package the invention, the top surface of the substrate may have a plurality of recessed portions for the plurality of chip bonding conductor layers to be disposed in, and, in the step of forming the plurality of sets of external connecting terminals, the plurality of chip bonding conductor layers may be formed at the same time such that the chip bonding conductor layers are disposed in the plurality of recessed portions.

In the method of manufacturing an electronic component package the invention, the electronic component chip may incorporate a plurality of electrodes, and the electronic component package may incorporate a plurality of terminal connecting portions each of which connects at least one of the electrodes and at least one of the external connecting terminals to each other. In this case, the method further includes the step of forming the terminal connecting portions between the step of bonding the at least one electronic component chip to each of the pre-base portions and the step of cutting the wafer.

The step of forming the terminal connecting portions may include the steps of: forming an insulating layer that has a flattened top surface and that covers the wafer and the electronic component chip; forming a plurality of openings in the insulating layer for exposing the external connecting terminals and the electrodes; and forming the terminal connecting portions by plating such that portions thereof are inserted to the openings.

The electronic component package may incorporate a plurality of electronic component chips and may further incorporate at least one inter-chip connecting portion for electrically connecting electrodes of the plurality of electronic component chips to one another, and the inter-chip connecting portion may be formed at the same time as the terminal connecting portions are formed.

The method of manufacturing an electronic component package of the invention may further include the step of forming a sealer for sealing the at least one electronic component chip between the step of bonding the at least one electronic component chip to each of the pre-base portions and the step of cutting the wafer.

In the method of manufacturing an electronic component package of the invention, the base may have a side surface, and end faces of the plurality of external connecting terminals may be exposed at the side surface of the base.

The electronic component package may further incorporate a plurality of terminal plating films that are disposed on the side surface of the base and respectively connected to the end faces of the external connecting terminals. In this case, the method further includes the step of forming the plurality of terminal plating films after the step of cutting the wafer.

The electronic component package may further incorporate a plurality of terminal pins respectively connected to the external connecting terminals. In this case, the method further includes the step of connecting the terminal pins to the end faces of the external connecting terminals after the step of cutting the wafer.

A wafer for electronic component packages manufactured through a method of manufacturing a wafer for electronic component packages of the invention is used for manufacturing a plurality of electronic component packages each of which incorporates: a base incorporating a plurality of external connecting terminals; and at least one electronic component chip that is bonded to the base and electrically connected to at least one of the external connecting terminals. The wafer for electronic component packages incorporates: a substrate having a top surface; and a plurality of sets of external connecting terminals that correspond to the plurality of electronic component packages and that are provided on the top surface of the substrate. The wafer includes a plurality of pre-base portions that will be each subjected to bonding of the at least one electronic component chip thereto and will be subjected to separation from one another later so that each of them will thereby become the base.

The method of manufacturing a wafer for electronic component packages of the invention includes the steps of: fabricating the substrate; and forming the plurality of sets of external connecting terminals on the top surface of the substrate by plating.

The wafer may further incorporate a plurality of chip bonding conductor layers to each of which the at least one electronic component chip is to be bonded, the plurality of chip bonding conductor layers being disposed on the top surface of the substrate.

In the method of manufacturing a wafer for electronic component packages of the invention, the step of forming the plurality of sets of external connecting terminals may include: the step of forming a plurality of first plating layers by plating, the plurality of first plating layers being to become portions of the respective external connecting terminals; and the step of forming a plurality of second plating layers by plating such that the second plating layers are respectively disposed on the first plating layers. In the step of forming the plurality of first plating layers, a plurality of chip bonding plating layers that are to constitute the plurality of chip bonding conductor layers may be formed at the same time.

In the method of manufacturing a wafer for electronic component packages of the invention, the top surface of the substrate may have a plurality of recessed portions for the plurality of chip bonding conductor layers to be disposed in, and, in the step of forming the plurality of sets of external connecting terminals, the plurality of chip bonding conductor layers may be formed at the same time such that the chip bonding conductor layers are disposed in the plurality of recessed portions.

A substructure for electronic component packages manufactured through a method of manufacturing a substructure for electronic component packages of the invention is used for manufacturing a plurality of electronic component packages each of which incorporates: a base incorporating a plurality of external connecting terminals; and at least one electronic component chip that is bonded to the base and electrically connected to at least one of the external connecting terminals. The substructure incorporates a wafer incorporating: a substrate having a top surface; and a plurality of sets of external connecting terminals that correspond to the plurality of electronic component packages and that are provided on the top surface of the substrate, the wafer including a plurality of pre-base portions that will be separated from one another later so that each of them will thereby become the base. The substructure further incorporates a plurality of electronic component chips bonded to the plurality of pre-base portions of the wafer.

The method of manufacturing a substructure for electronic component packages of the invention includes the steps of: fabricating the wafer; and bonding at least one electronic component chip to each of the pre-base portions of the wafer. The step of fabricating the wafer includes the step of forming the plurality of sets of external connecting terminals on the top surface of the substrate by plating.

In the method of manufacturing a substructure for electronic component packages of the invention, the wafer may further incorporate a plurality of chip bonding conductor layers to each of which the at least one electronic component chip is to be bonded, the plurality of chip bonding conductor layers being disposed on the top surface of the substrate.

In the method of manufacturing a substructure for electronic component packages of the invention, the step of forming the plurality of sets of external connecting terminals may include: the step of forming a plurality of first plating layers by plating, the plurality of first plating layers being to become portions of the respective external connecting terminals; and the step of forming a plurality of second plating layers by plating such that the second plating layers are respectively disposed on the first plating layers. In the step of forming the plurality of first plating layers, a plurality of chip bonding plating layers that are to constitute the plurality of chip bonding conductor layers may be formed at the same time.

In the method of manufacturing a substructure for electronic component packages of the invention, the top surface of the substrate may have a plurality of recessed portions for the plurality of chip bonding conductor layers to be disposed in, and, in the step of forming the plurality of sets of external connecting terminals, the plurality of chip bonding conductor layers may be formed at the same time such that the chip bonding conductor layers are disposed in the plurality of recessed portions.

In the method of manufacturing a substructure for electronic component packages of the invention, each of the electronic component chips may incorporate a plurality of electrodes, and each of the electronic component packages may incorporate a plurality of terminal connecting portions each of which connects at least one of the electrodes and at least one of the external connecting terminals to each other. In this case, the method further includes the step of forming the terminal connecting portions after the step of bonding at least one electronic component chip to each of the pre-base portions.

The step of forming the terminal connecting portions may include the steps of: forming an insulating layer that has a flattened top surface and that covers the wafer and the electronic component chips; forming a plurality of openings in the insulating layer for exposing the external connecting terminals and the electrodes; and forming the terminal connecting portions by plating such that portions thereof are inserted to the openings.

Each of the electronic component packages may incorporate a plurality of electronic component chips and further incorporate at least one inter-chip connecting portion for electrically connecting the electrodes of the plurality of electronic component chips to one another, and the inter-chip connecting portion may be formed at the same time as the terminal connecting portions are formed.

The method of manufacturing a substructure for electronic component packages of the invention may further include the step of forming a sealer for sealing the electronic component chips after the step of bonding at least one electronic component chip to each of the pre-base portions.

According to the method of manufacturing an electronic component package of the invention, there is fabricated the wafer incorporating: the substrate having the top surface; and the plurality of sets of external connecting terminals that correspond to a plurality of electronic component packages and that are provided on the top surface of the substrate, the wafer including the plurality of pre-base portions that will be separated from one another later so that each of them will thereby become the base. At least one electronic component chip is then bonded to each of the pre-base portions of the wafer. The wafer is then cut so that the pre-base portions are separated from one another and a plurality of bases are thereby formed. The step of fabricating the wafer includes the step of forming the plurality of sets of external connecting terminals on the top surface of the substrate by plating.

According to the method of manufacturing an electronic component package of the invention, it is possible to mass-produce electronic component packages at low costs in a short period of time and to respond to alterations to specifications flexibly and quickly. Likewise, according to the method of manufacturing a wafer for electronic component packages or the method of manufacturing a substructure for electronic component packages of the invention, it is possible to mass-produce electronic component packages at low costs in a short period of time and to respond to alterations to specifications flexibly and quickly.

Other and further objects, features and advantages of the invention will appear more fully from the following description.

DETAILED DESCRIPTION OF THE PREFERRED EMBODIMENTS

First Embodiment

Preferred embodiments of the invention will now be described in detail with reference to the accompanying drawings. Reference is now made to FIG. 1 to FIG. 4 to describe the outline of a method of manufacturing an electronic component package of a first embodiment of the invention.

The method of manufacturing an electronic component package of the first embodiment is a method of manufacturing an electronic component package incorporating a base having a plurality of external connecting terminals, and at least one electronic component chip bonded to the base and electrically connected to at least one of the plurality of external connecting terminals.

Figure 1:
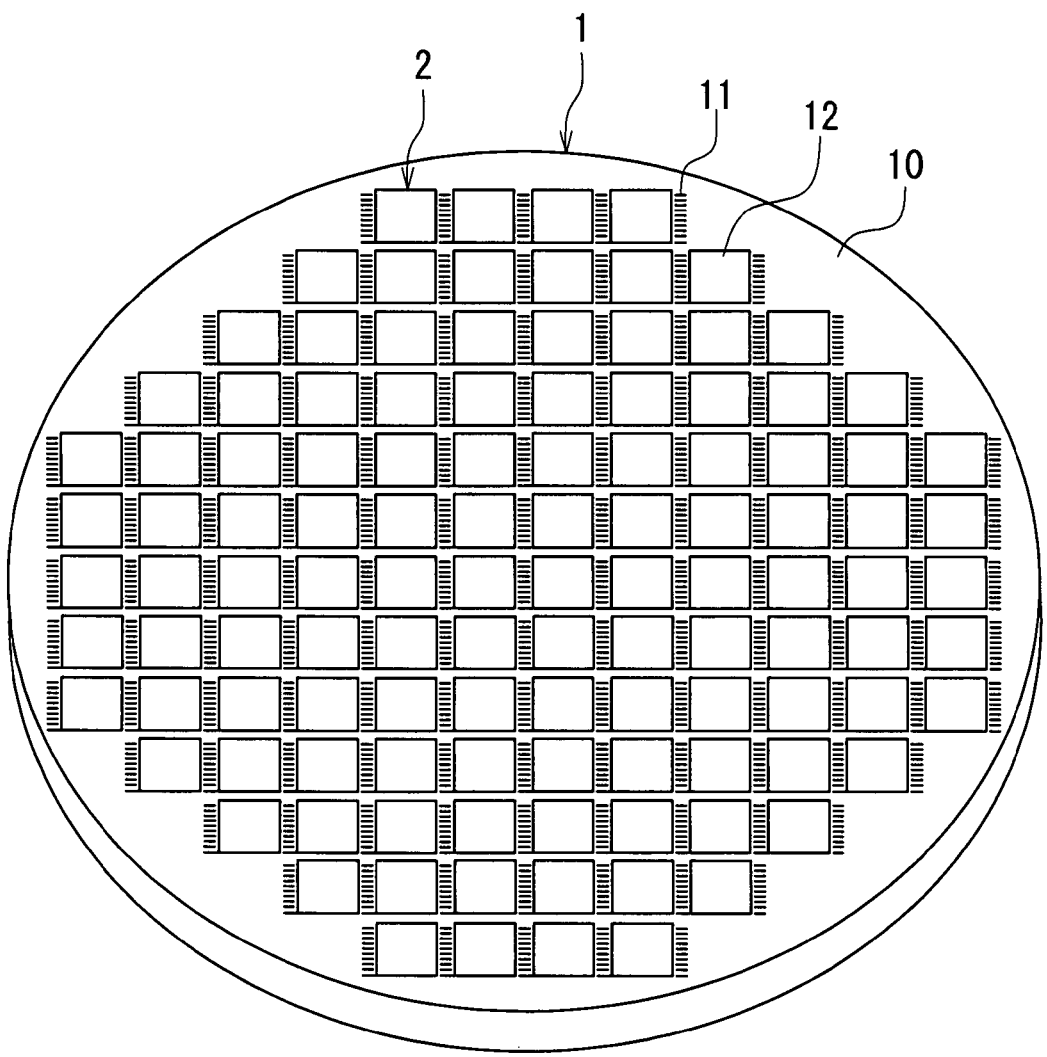
FIG. 1 is an explanatory view illustrating a wafer for electronic component packages of a first embodiment of the invention.

FIG. 1 illustrates a first step of the method of manufacturing an electronic component package of the embodiment. In this step, a wafer for electronic component packages (which is hereinafter simply called a wafer) 1 of the embodiment is fabricated. The wafer 1 incorporates: a substrate 10 having a top surface; and a plurality of sets of external connecting terminals 11 that correspond to a plurality of electronic component packages and that are provided on the top surface of the substrate 10. The wafer 1 does not include any circuit element. The wafer 1 includes a plurality of pre-base portions 2 that will be separated from one another later to thereby become the bases of the respective electronic component packages. The pre-base portions 2 are arranged such that a plurality of portions 2 are respectively aligned in vertical and horizontal directions. In the example illustrated in FIG. 1, in each of the pre-base portions 2, a plurality of external connecting terminals 11 are disposed on both sides opposed to each other in the horizontal direction. In the example illustrated in FIG. 1, at the boundary between two of the pre-base portions 2 adjacent to each other along the horizontal direction, among a plurality of external connecting terminals 11 of the adjacent two of the pre-base portions 2, the ones closer to the boundary are coupled to each other. FIG. 1 illustrates an example in which the wafer 1 is circular-plate-shaped. However, the wafer 1 may have any shape, and may be shaped like a plate whose top and bottom surfaces are rectangular, for example.

The wafer 1 illustrated in FIG. 1 further incorporates a plurality of chip bonding conductor layers 12 provided on the top surface of the substrate 10. At least one electronic component chip is to be bonded to each of the chip bonding conductor layers 12. In the example illustrated in FIG. 1, one each chip bonding conductor layer 12 is allocated to each pre-base portion 2. A plurality of external connecting terminals 11 are disposed on both sides of each chip bonding conductor layer 12, the sides being opposed to each other in the horizontal direction. However, it is not necessarily required that the wafer 1 incorporate the chip bonding conductor layers 12.

As will be described in detail later, in the embodiment, the plurality of sets of external connecting terminals 11 and the plurality of chip bonding conductor layers 12 are formed on the top surface of the substrate 10 by plating.

Figure 2:
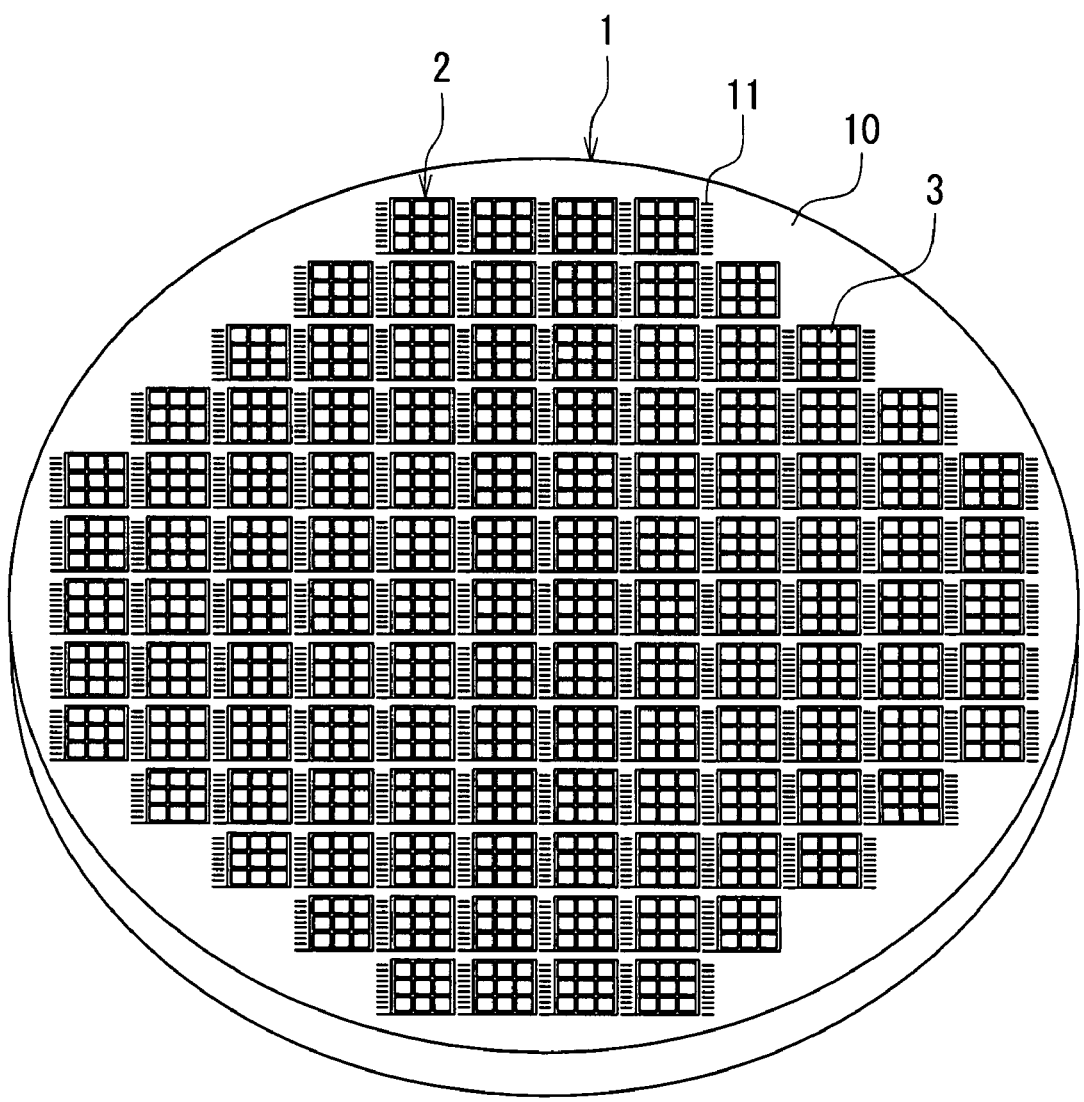
FIG. 2 is an explanatory view for explaining a method of manufacturing an electronic component package of the first embodiment of the invention.

FIG. 2 illustrates the following step. In the step, at least one electronic component chip (hereinafter simply called a chip) 3 is bonded to each of the pre-base portions 2 of the wafer 1.

FIG. 2 illustrates an example in which nine chips 3 are bonded to each of the pre-base portions 2. However, the number of the chip 3 to be bonded to each of the pre-base portions 2 may be any number. Furthermore, although not shown in FIG. 2, each of the chips 3 has a plurality of electrodes. The chips 3 may be semiconductor integrated circuit elements or other circuit elements, or may be sensors or actuators formed by using the micro-electro mechanical systems (MEMS), for example.

Figure 3:
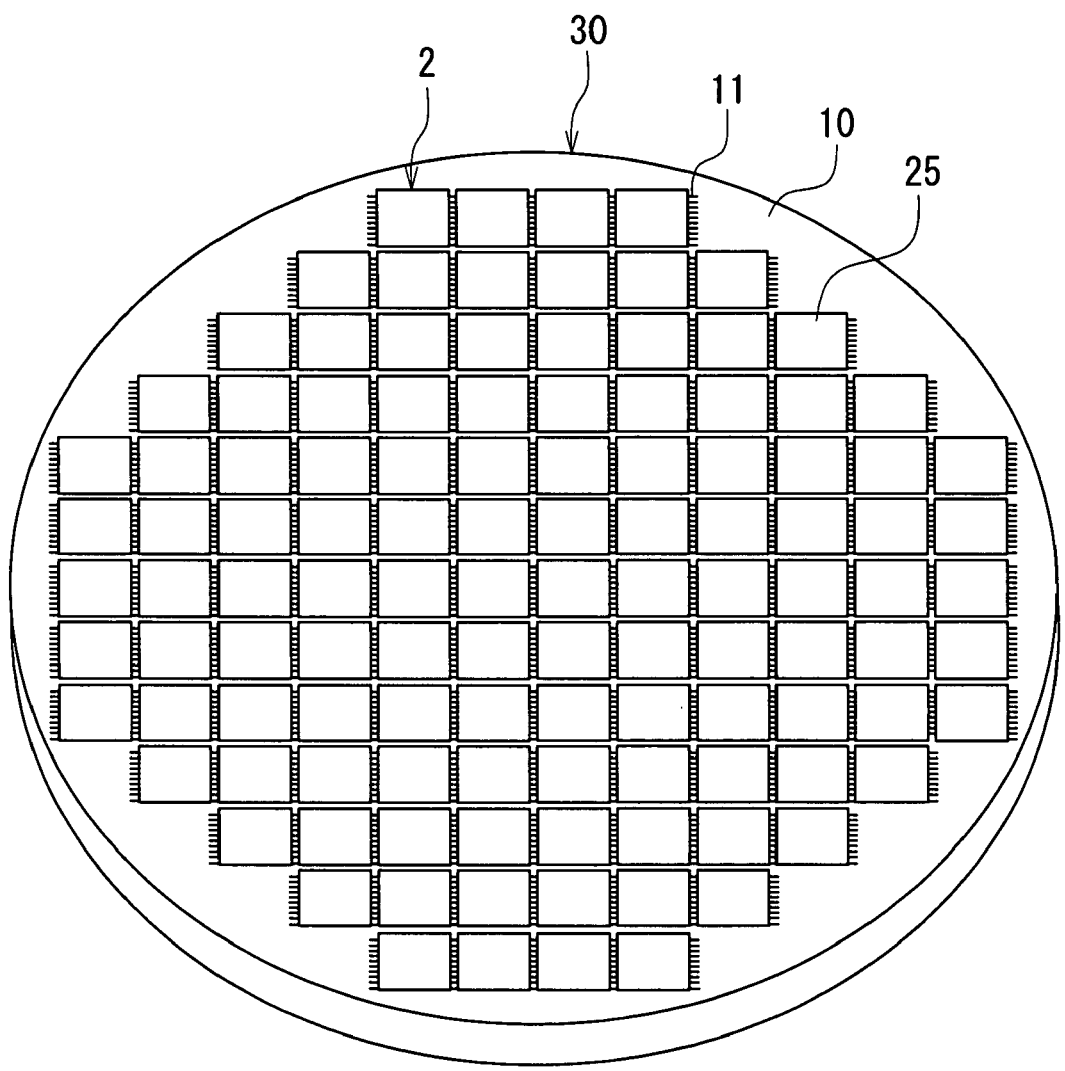
FIG. 3 is an explanatory view illustrating a substructure for electronic component packages of the first embodiment of the invention.

FIG. 3 illustrates the following step. In the step, first, although not shown, a plurality of terminal connecting portions are formed for each of the pre-base portions 2. Each of the terminal connecting portions electrically connects at least one electrode and at least one external connecting terminal 11 to each other. Alternatively, for example, flip-chip may be employed to directly connect the electrodes of the chips 3 to the external connecting terminal 11, instead of using the terminal connecting portions to connect therethrough the electrodes of the chips 3 to the external connecting terminal 11.

In a case in which a plurality of chips 3 are allocated to each of the pre-base portions 2, at least one inter-chip connecting portion may be formed for each of the pre-base portions 2, as required, to electrically connect the electrodes of the plurality of chips 3 to one another. The inter-chip connecting portion is formed at the same time as the terminal connecting portions, for example.

Next, sealers 25 for sealing the chips 3 are formed. FIG. 3 illustrates an example in which individual sealers 25 are formed for the respective pre-base portions 2. However, a single sealer 25 may be formed for sealing all the chips 3 of all the pre-base portions 2. If the electronic component package does not require sealing of the chips 3, it is not necessary to form any sealer 25.

The stack of layers fabricated through the steps illustrated in FIG. 1 to FIG. 3 is a substructure for electronic component packages (hereinafter simply called a substructure) 30 of the embodiment. The substructure 30 incorporates at least the wafer 1 and the plurality of chips 3. The substructure 30 may further incorporate the terminal connecting portions, the inter-chip connecting portions and the sealers 25.

Figure 4:
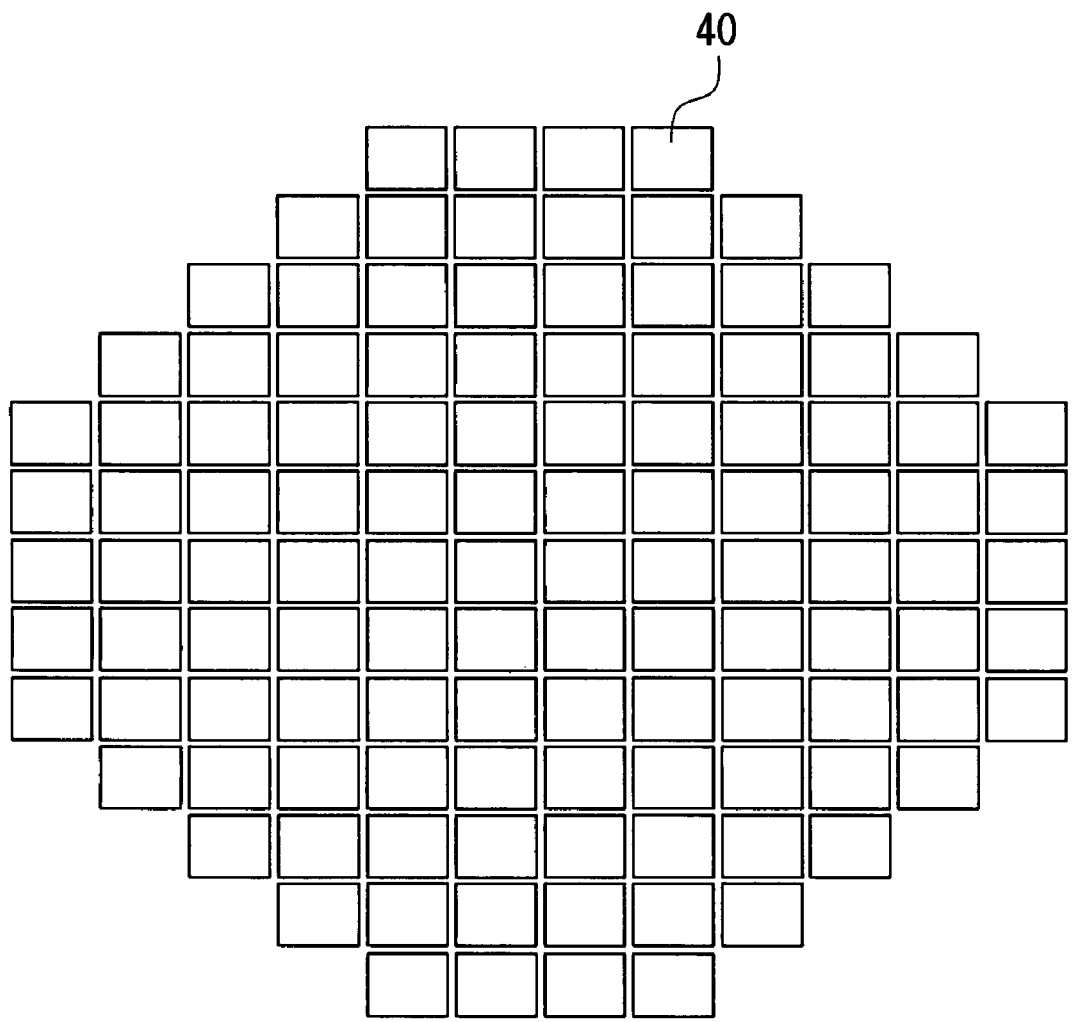
FIG. 4 is an explanatory view for explaining the method of manufacturing an electronic component package of the first embodiment of the invention.

FIG. 4 illustrates the following step. In the step, the substructure 30 including the wafer 1 is cut so that the pre-base portions 2 are separated from one another and a plurality of bases are thereby formed. As a result, there are formed a plurality of electronic component packages 40 each of which incorporates the base and at least one electronic component chip 3.

Reference is now made to FIG. 5 to FIG. 18 to describe the method of manufacturing an electronic component package of the embodiment in detail. In cross-sectional views of FIG. 11 to FIG. 18, to show respective portions clearly, the portions are drawn on a scale different from the scale on which the corresponding portions of the top views of FIG. 5 to FIG. 10 are drawn.

In the method of manufacturing an electronic component package of the embodiment, first, the wafer 1 is fabricated. The step of fabricating the wafer 1 corresponds to the method of manufacturing a wafer for electronic component packages of the embodiment. The step of fabricating the wafer 1 will now be described with reference to FIG. 5, FIG. 6, FIG. 11 and FIG. 12.

Figure 5:
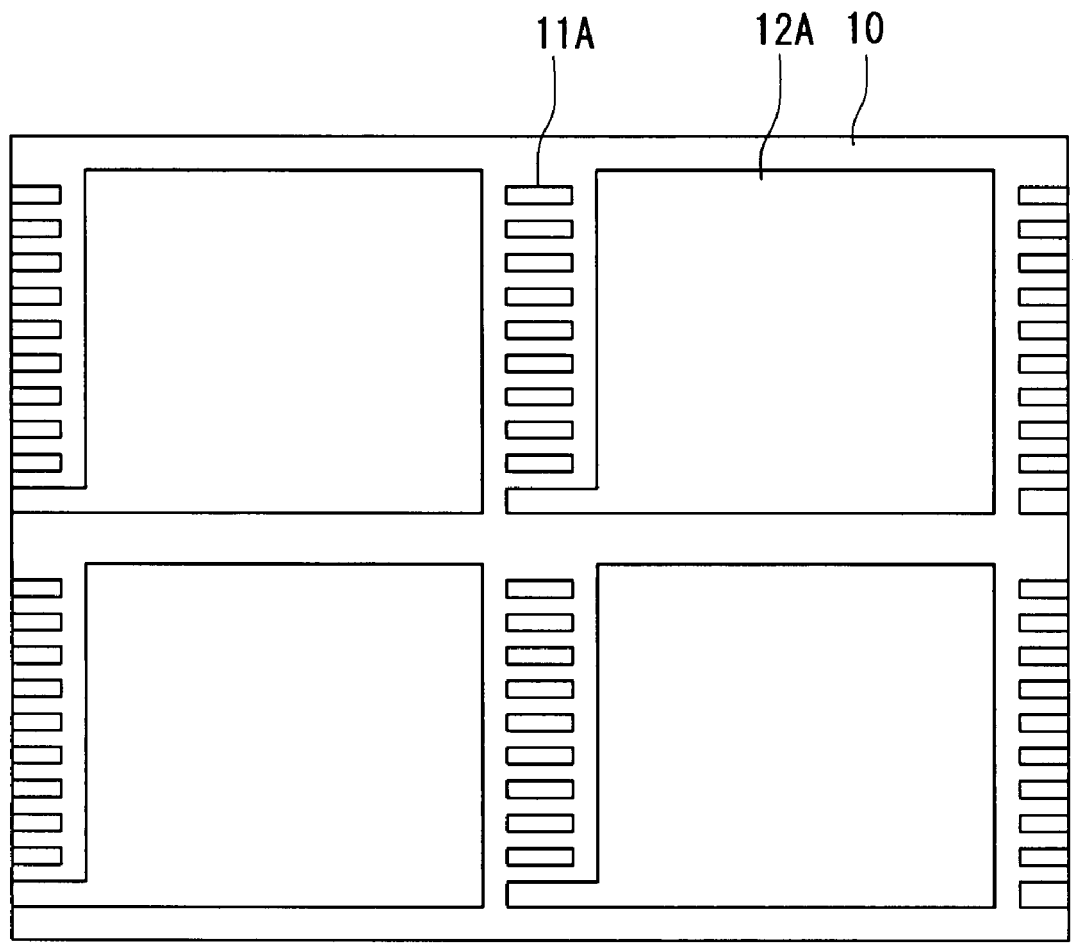
FIG. 5 is a top view illustrating part of a stack of layers fabricated in a step of the method of manufacturing an electronic component package of the first embodiment of the invention.
Figure 11:
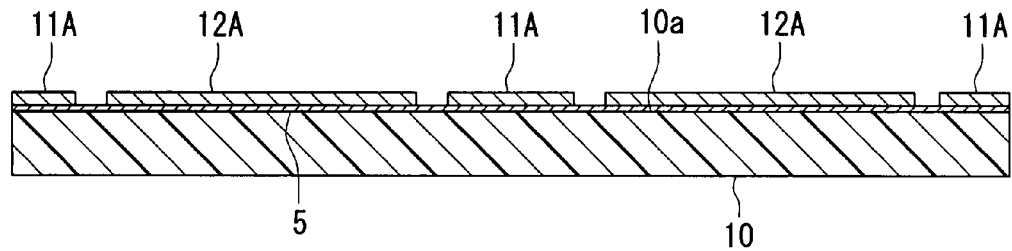
FIG. 11 is a cross-sectional view illustrating part of a stack of layers fabricated in a step of the method of manufacturing an electronic component package of the first embodiment of the invention.

FIG. 5 and FIG. 11 illustrate a step performed in the course of fabricating the wafer 1. FIG. 5 is a top view illustrating part of a stack of layers fabricated through this step. FIG. 11 is a cross-sectional view illustrating part of the stack of layers fabricated in this step. In this step, first, the substrate 10 is fabricated. As shown in FIG. 11, the substrate 10 is in the form of a plate having a flat top surface 10a. At least a portion of the substrate 10 including the top surface 10a is made of an insulating material or a high-resistance material. The substrate 10 can be made of a resin, a ceramic or glass, for example. The substrate 10 may also be made of glass fibers solidified with a resin. The substrate 10 may also be made of a structure in which an insulating film is formed on one of surfaces of a plate made of a semiconductor material such as silicon.

Next, a seed layer 5 for plating is formed by sputtering, for example, to entirely cover the top surface 10a of the substrate 10. The seed layer 5 has a thickness within a range of 50 to 200 nm inclusive, for example. The seed layer 5 can be made of Cu, Ni, Cr, Fe or Au, for example.

Next, on the seed layer 5 there are formed a plurality of first plating layers 11A that are to become portions of the respective the external connecting terminals 11, and a plurality of chip bonding plating layers 12A that are to constitute the plurality of chip bonding conductor layers 12. Each of the first plating layers 11A and the chip bonding plating layers 12A has a thickness within a range of 5 to 10 µm inclusive, for example.

Figure 6:
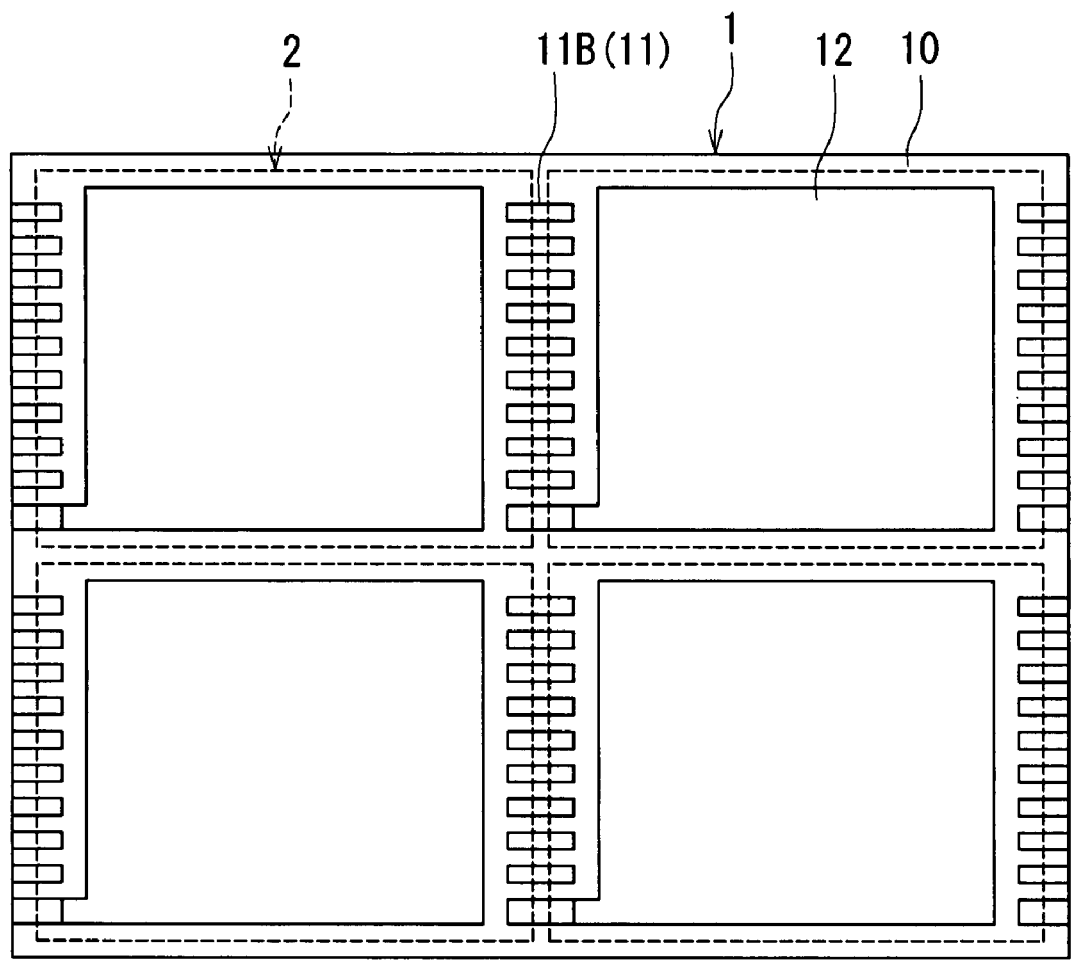
FIG. 6 is a top view illustrating part of a stack of layers obtained in a step that follows the step illustrated in FIG. 5.
Figure 12:
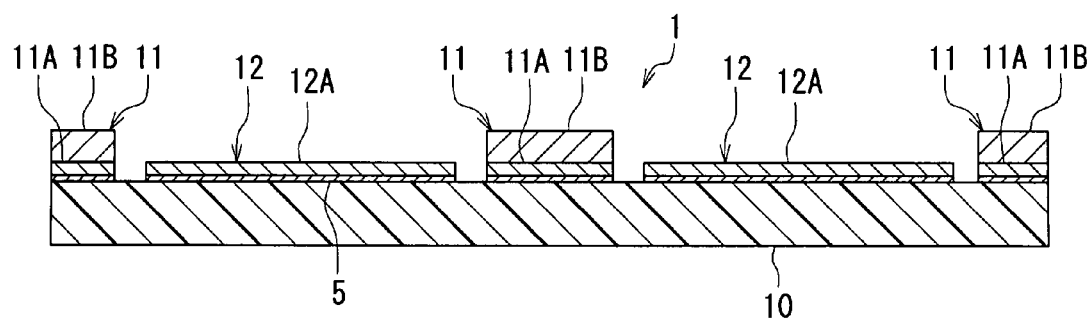
FIG. 12 is a cross-sectional view illustrating part of a stack of layers obtained in a step that follows the step illustrated in FIG. 11.

FIG. 6 and FIG. 12 illustrate the following step. FIG. 6 is a top view illustrating part of a stack of layers fabricated through this step. FIG. 12 is a cross-sectional view illustrating part of the stack of layers fabricated through this step. In the step, first, a plurality of second plating layers 11B are formed by plating such as frame plating such that the second plating layers 11B are respectively disposed on the first plating layers 11A. Each of the second plating layers 11B has a thickness within a range of 30 to 500 µm inclusive, for example. The plating layers 11A, 11B and 12A can be made of any of Cu, Ni, Fe, Ru and Cr, or an alloy containing any of these, or NiFe or CoNiFe, for example.

Next, the seed layer 5 except portions thereof located below the plating layers 11A and 12A are removed by etching using the chip bonding plating layers 12A and layered films made up of the plating layers 11A and 11B as masks. As a result, the external connecting terminals 11 are formed of the plating layers 11A and 11B and portions of the seed layer 5 remaining below the plating layers 11A. In addition, the chip bonding conductor layers 12 are formed of the chip bonding plating layers 12A and portions of the seed layer 5 remaining therebelow. The wafer 1 is thus fabricated.

The thickness of each external connecting terminal 11 is greater than the thickness of each chip bonding conductor layer 12 by the thickness of each second plating layer 11B. A difference in level is created between the top surface of each external connecting terminal 11 and the top surface of each chip bonding conductor layer 12, so that the top surface of each external connecting terminal 11 is located above the top surface of each chip bonding conductor layer 12. It is preferred that this difference in level be equal to or nearly equal to the thickness of the chips 3 that will be disposed on the chip bonding conductor layers 12 later. In a case in which the chips 3 are fabricated by using a semiconductor wafer having a diameter of 200 or 300 mm, for example, the thickness of the chips 3 may be nearly equal to the thickness of the semiconductor wafer. In a case in which the chips 3 are fabricated by using a semiconductor wafer, the thickness of the chips 3 may be reduced by polishing and thereby thinning the semiconductor wafer. In the case in which the chips 3 are fabricated by using a semiconductor wafer, the thickness of the chips 3 is within a range of 30 to 800 µm inclusive, for example, but may be greater than 800 µm. The thickness of the chips 3 is preferably within a range of 30 to 250 µm inclusive.

Although it is not absolutely necessary to provide the chip bonding conductor layers 12, it is preferred to provide them because of the following reason. First, if the chip bonding conductor layers 12 are not provided, the chips 3 are to be directly bonded to the substrate 10 made of a resin or a ceramic, for example. In this case, it is impossible to bond the chips 3 to the substrate 10 through the use of solder. In contrast, if the chip bonding conductor layers 12 are provided, it is easy to bond the chips 3 to the chip bonding conductor layers 12 through the use of solder. Furthermore, in the case in which the chip bonding conductor layers 12 are provided, it is possible to connect the chips 3 to the ground by using the chip bonding conductor layers 12 as the ground. It is thereby possible to achieve advantages such as a reduction in noise generated in the chips 3.

Figure 7:
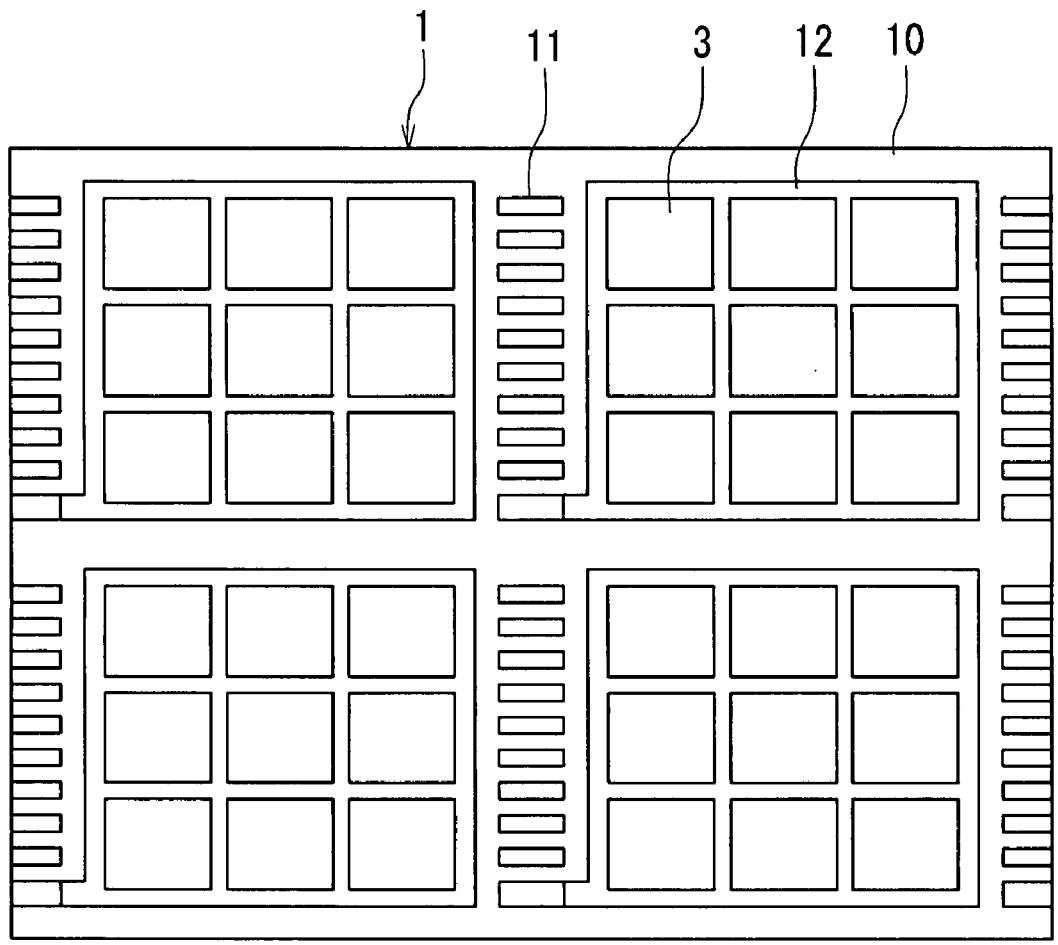
FIG. 7 is a top view illustrating part of a stack of layers obtained in a step that follows the step illustrated in FIG. 6.
Figure 13:
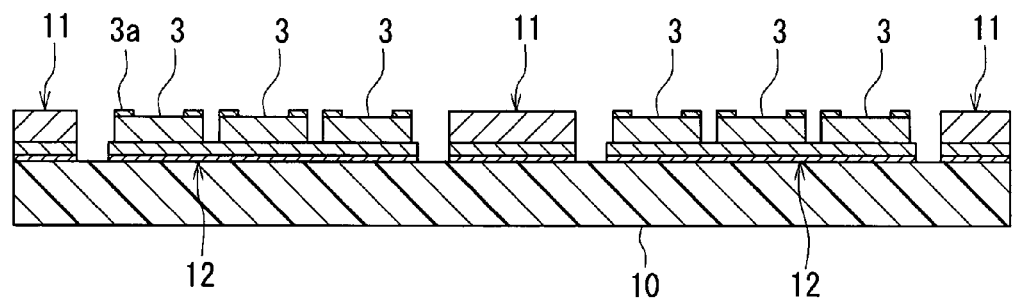
FIG. 13 is a cross-sectional view illustrating part of a stack of layers obtained in a step that follows the step illustrated in FIG. 12.

FIG. 7 and FIG. 13 illustrate the following step. FIG. 7 is a top view illustrating part of a stack of layers fabricated through this step. FIG. 13 is a cross-sectional view illustrating part of the stack of layers fabricated through this step. In this step, at least one chip 3 is bonded to each of the chip bonding conductor layers 12 of each of the pre-base portions 2. FIG. 7 and FIG. 13 illustrate an example in which nine chips 3 are bonded to each chip bonding conductor layer 12. Each of the chips 3 has a top surface, a bottom surface, and a plurality of electrodes 3a disposed on the top surface. Each of the chips 3 is disposed such that the bottom surface is bonded to the chip bonding conductor layer 12. The top surface of each electrode 3a is located at the same height or nearly the same height as the top surface of each external connecting terminal 11.

Figure 8:
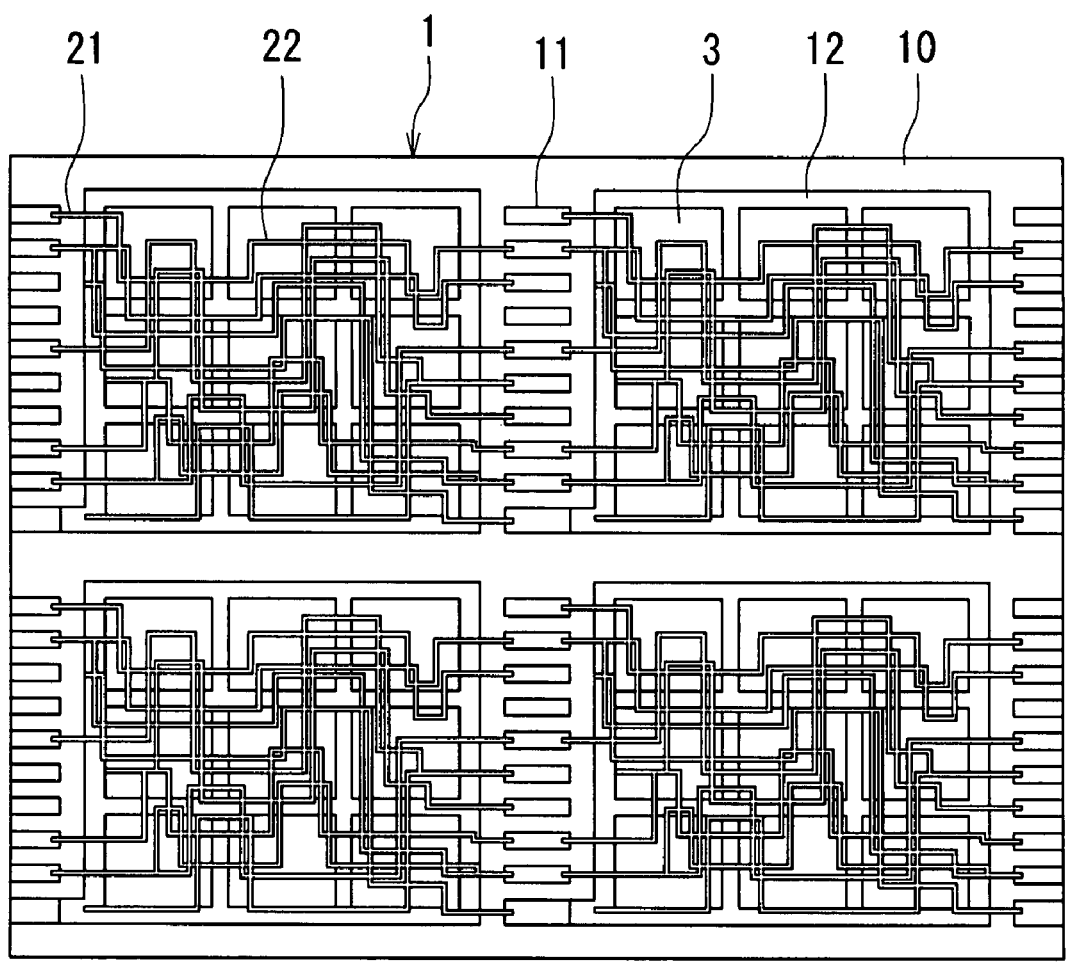
FIG. 8 is a top view illustrating part of a stack of layers obtained in a step that follows the step illustrated in FIG. 7.
Figure 14:
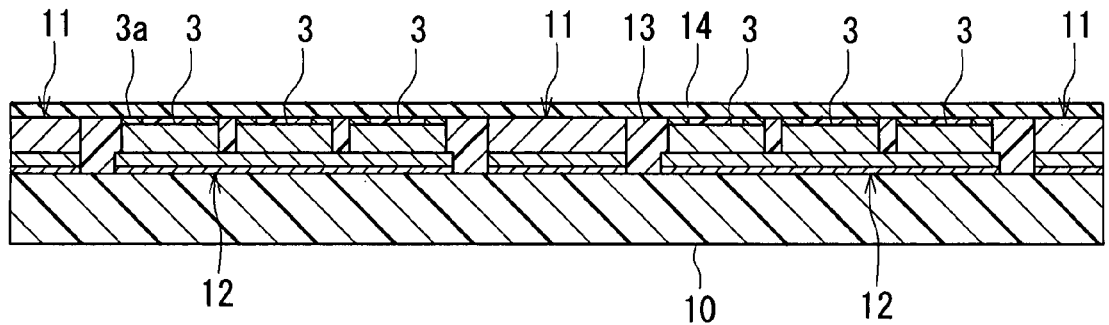
FIG. 14 is a cross-sectional view illustrating part of a stack of layers obtained in a step that follows the step illustrated in FIG. 13.
Figure 15:
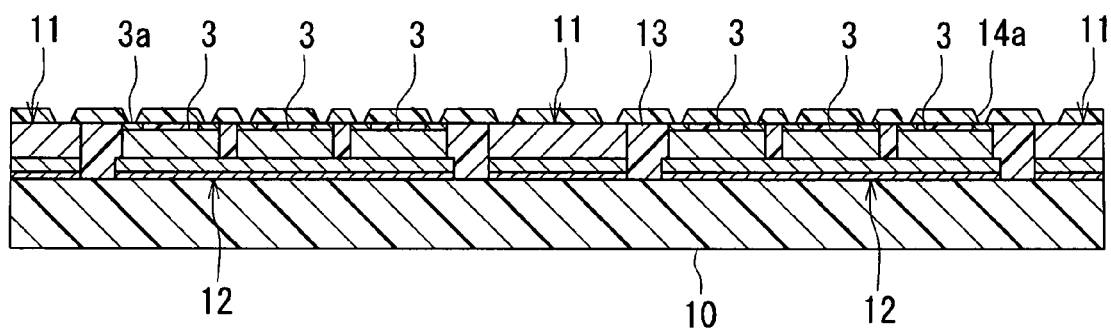
FIG. 15 is a cross-sectional view illustrating part of a stack of layers obtained in a step that follows the step illustrated in FIG. 14.
Figure 16:
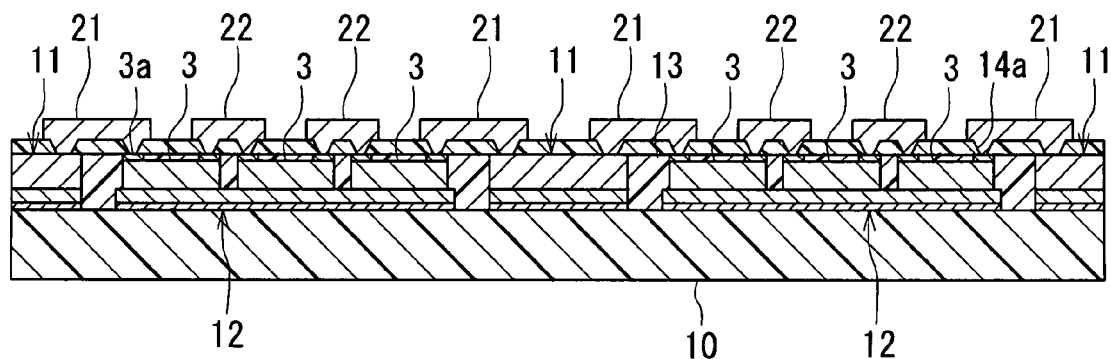
FIG. 16 is a cross-sectional view illustrating part of a stack of layers obtained in a step that follows the step illustrated in FIG. 15.

Next, the step of forming the terminal connecting portions and the inter-chip connecting portions is performed. This step will now be described with reference to FIG. 8 and FIG. 14 to FIG. 16. FIG. 8 is a top view illustrating part of a stack of layers fabricated through this step. FIG. 14 is a cross-sectional view illustrating part of a stack of layers obtained in a step that follows a step of FIG. 13. FIG. 15 is a cross-sectional view illustrating part of a stack of layers obtained in a step that follows the step of FIG. 14. FIG. 16 is a cross-sectional view illustrating part of a stack of layers obtained in a step that follows the step of FIG. 15.

In this step, first, as shown in FIG. 14, an insulating layer 13 is formed so that the recessed portions of the stack of layers shown in FIG. 13 are filled with the insulating layer 13. For example, the insulating layer 13 may be formed by making the recessed portions of the stack of layers of FIG. 13 be filled with an uncured polyimide resin, flattening the top surface thereof, and then hardening the polyimide resin at a temperature of 200° C. or lower. The top surface of the stack of layers is thereby flattened. Next, an insulating layer 14 is formed on the flattened top surface of the stack of layers. For example, the insulating layer 14 may be made of a photosensitive material such as a polyimide resin containing a sensitizer. The top surface of the insulating layer 14 is flattened, too.

Next, as shown in FIG. 15, openings (via holes) 14a for exposing the external connecting terminals 11 and the electrodes 3a are formed in the insulating layer 14. In the case in which the insulating layer 14 is made of a photosensitive material, it is possible to form the openings 14a in the insulating layer 14 by photolithography. In the case in which the insulating layer 14 is not made of a photosensitive material, it is possible to form the openings 14a in the insulating layer 14 by selectively etching the insulating layer 14.

Next, as shown in FIG. 8 and FIG. 16, a plurality of terminal connecting portions 21 and a plurality of inter-chip connecting portions 22 are formed at the same time by plating such as frame plating. Each of the terminal connecting portions 21 electrically connects at least one of the electrodes 3a to at least one of the external connecting terminals 11. Each of the inter-chip connecting portions 22 electrically connects the electrodes 3a of the plurality of chips 3 disposed on the pre-base portion 2 to one another. The terminal connecting portions 21 and the inter-chip connecting portions 22 can be made of Cu, Ni, Cr, Fe or Au, for example. Among these materials, Cu or Au that has an excellent conductivity is preferred. In FIG. 8 the insulating layers 13 and 14 are omitted. When the terminal connecting portions 21 and the inter-chip connecting portions 22 are formed, a connecting portion for connecting different ones of the electrodes of each chip 3 to each other, or a connecting portion for connecting different ones of the external connecting terminals 11 to each other may be formed at the same time.

Figure 9:
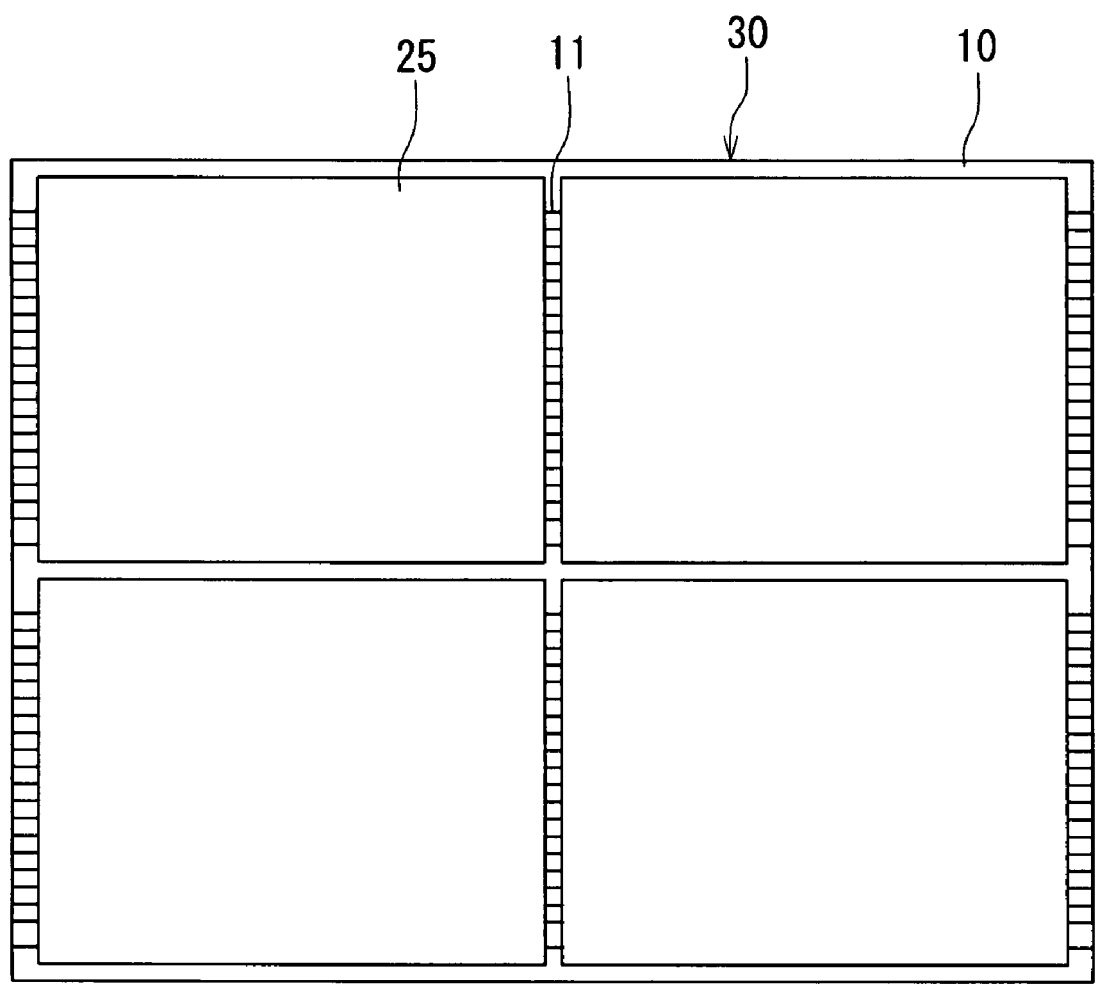
FIG. 9 is a top view illustrating part of a stack of layers obtained in a step that follows the step illustrated in FIG. 8.
Figure 17:
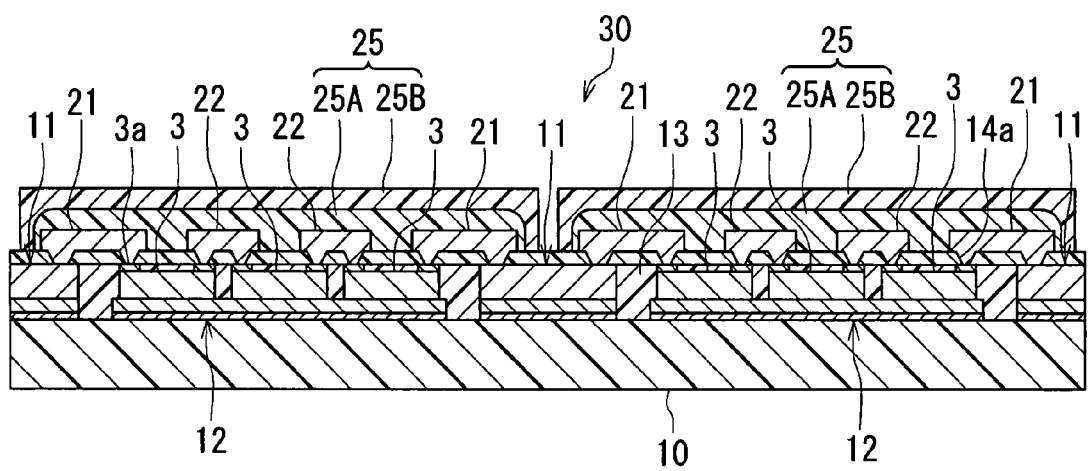
FIG. 17 is a cross-sectional view illustrating part of a stack of layers obtained in a step that follows the step illustrated in FIG. 16.

Next, the step of forming the sealer 25 is performed. This step will now be described with reference to FIG. 9 and FIG. 17. FIG. 9 is a top view illustrating part of a stack of layers fabricated in this step. FIG. 17 is a cross-sectional view illustrating part of the stack of layers fabricated in this step. In FIG. 9 the insulating layer 14 is omitted. In this step, first, as shown in FIG. 17, a first sealing layer 25A is formed to cover the terminal connecting portions 21 and the inter-chip connecting portions 22. Next, a second sealing layer 25B is formed to cover the first sealing layer 25A. Before forming the first sealing layer 25A, a passivation film may be formed, if necessary, to cover the terminal connecting portions 21 and the inter-chip connecting portions 22. The second sealing layer 25B may be made of a typical mold resin or a ceramic. The first sealing layer 25A is provided for preventing damage to the chips 3, the terminal connecting portions 21 and the inter-chip connecting portions 22 resulting from a stress generated by the second sealing layer 25B. The first sealing layer 25A is made of a silicone resin, for example. The sealer 25 for sealing the chips 3 is formed of the first sealing layer 25A and the second sealing layer 25B. FIG. 9 and FIG. 17 illustrate an example in which individual sealers 25 are formed for the respective pre-base portions 2. However, a single sealer 25 may be formed to seal all the chips 3 of all the pre-base portions 2.

The substructure 30 is fabricated in the foregoing manner. The series of the foregoing steps corresponds to the method of manufacturing a substructure for electronic component packages of the embodiment. The substructure 30 incorporates the wafer 1, the plurality of chips 3, the plurality of terminal connecting portions 21, the plurality of inter-chip connecting portions 22, and the plurality of sealers 25.

Figure 10:
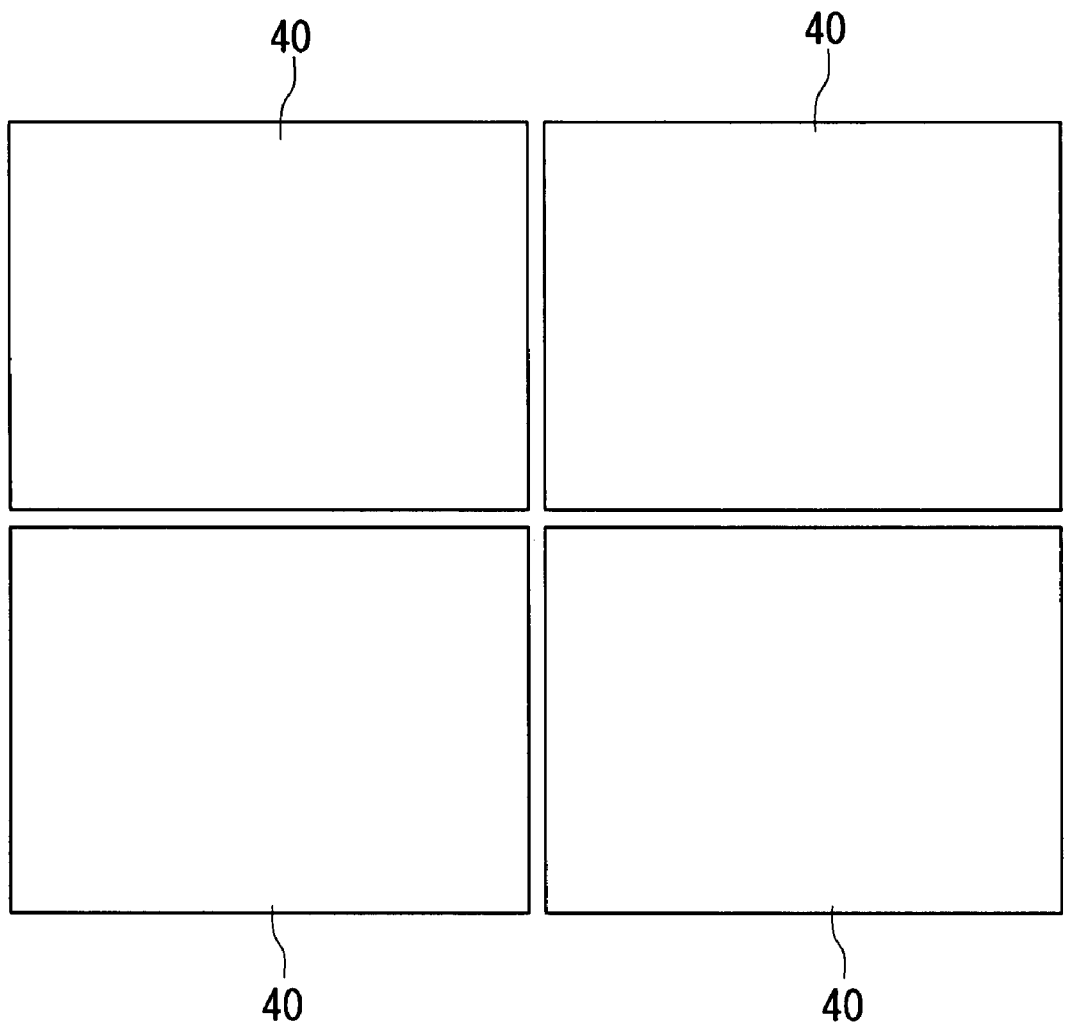
FIG. 10 is a top view illustrating electronic component packages fabricated in a step that follows the step illustrated in FIG. 9.
Figure 18:
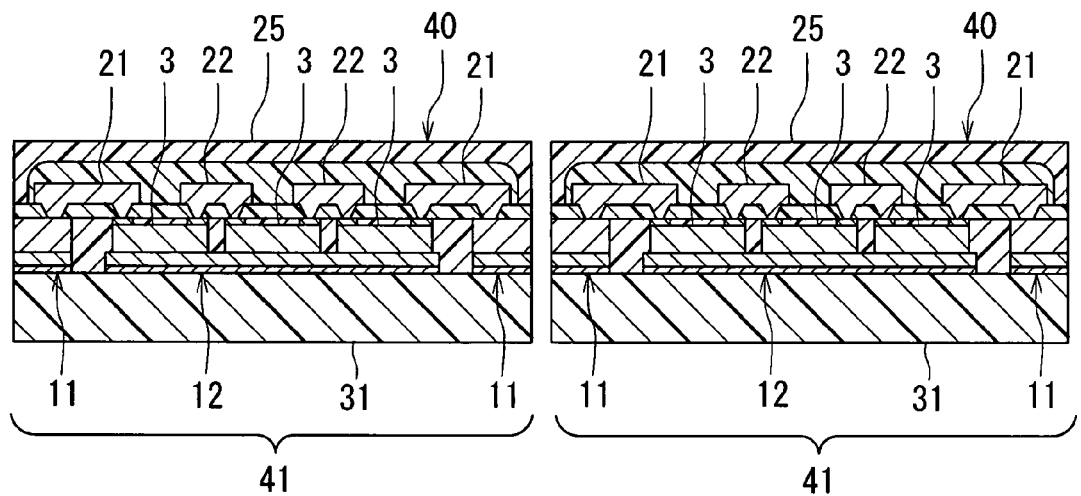
FIG. 18 is a cross-sectional view illustrating electronic component packages fabricated in a step that follows the step illustrated in FIG. 17.

FIG. 10 and FIG. 18 illustrate the following step. FIG. 10 is a top view illustrating electronic component packages fabricated in this step. FIG. 18 is a cross-sectional view illustrating the electronic component packages fabricated in this step. In this step, the substructure 30 including the wafer 1 is cut so that the pre-base portions 2 are separated from one another and a plurality of bases 41 are thereby formed. As a result, a plurality of electronic component packages 40 each of which incorporates the base 41 and at least one chip 3 are formed. Each base 41 includes a plurality of external connecting terminals 11, one chip bonding conductor layer 12, and a retainer 31 for retaining the terminals 11 and the conductor layer 12. The retainer 31 is formed by cutting the substrate 10. Each electronic component package 40 further incorporates a plurality of terminal connecting portions 21 and the sealer 25. In the case where each electronic component package 40 incorporates a plurality of chips 3, at least one inter-chip connecting portion 22 may be further provided in each electronic component package 40.

Figure 19:
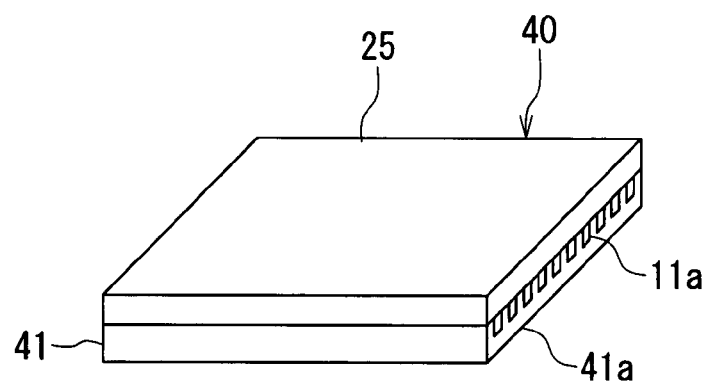
FIG. 19 is a perspective view illustrating an electronic component package of the first embodiment of the invention.

FIG. 19 is a perspective view illustrating an appearance of the electronic component package 40. As shown in FIG. 19, the electronic component package 40 is rectangular-solid-shaped, for example. In this case, the base 41 has four side surfaces 41a. In at least one of the side surfaces 41a, such as two of the side surfaces 41a, the end faces 11a of the plurality of external connecting terminals 11 are exposed.

Figure 20:
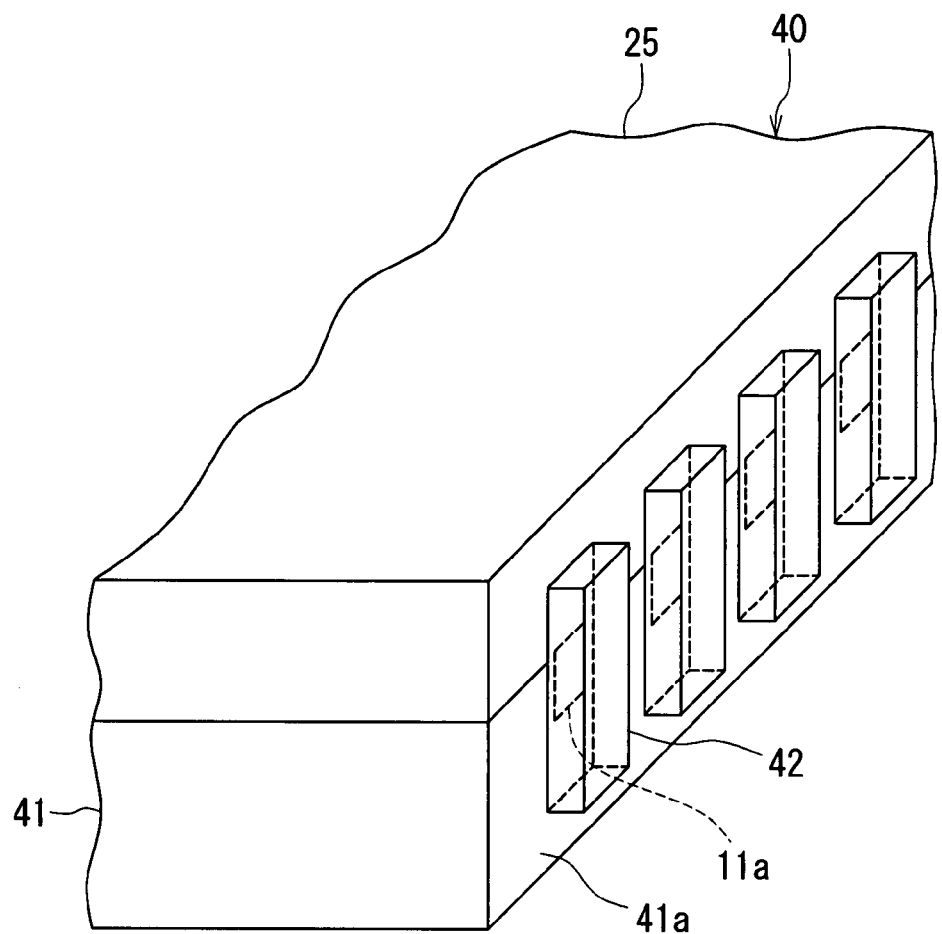
FIG. 20 is a perspective view illustrating part of the electronic component package of the first embodiment of the invention.

FIG. 20 illustrates part of the electronic component package 40 on a magnified scale. As shown in FIG. 20, the electronic component package 40 may further incorporate a plurality of terminal plating films 42 disposed on the side surfaces 41a of the base 41 and respectively connected to the end faces 11a of the external connecting terminals 11. In this case, the method of manufacturing the electronic component package 40 further includes the step of forming the plurality of terminal plating films 42 after the step of cutting the substructure 30 including the wafer 1. In this case, too, it is preferred to polish, before forming the plating films 42, the side surfaces 41a on which the plating films 42 are to be disposed. The plating films 42 are made of Au, for example.

Figure 21:
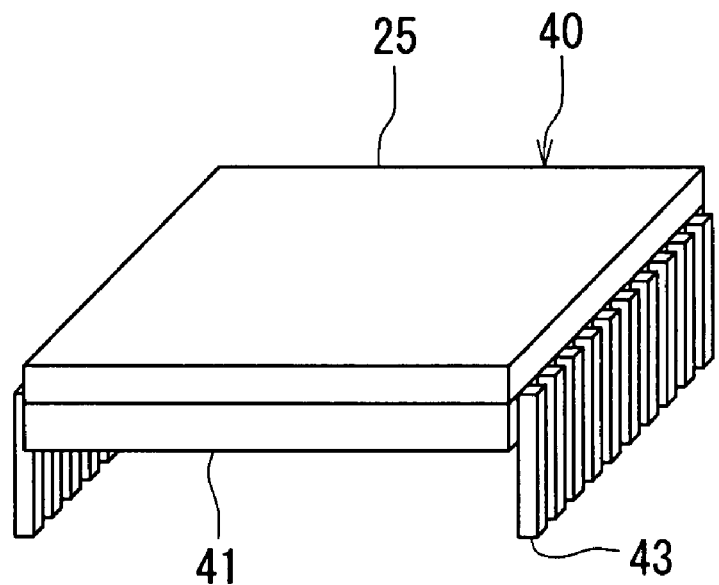
FIG. 21 is a perspective view illustrating another configuration of the electronic component package of the first embodiment of the invention.

FIG. 21 is a perspective view illustrating another configuration of the electronic component package 40. Although the electronic component package 40 may have the configuration shown in FIG. 19 or FIG. 20, the package 40 may further incorporate, as shown in FIG. 21, a plurality of terminal pins 43 respectively connected to the external connecting terminals 11. In this case, the method of manufacturing the electronic component package 40 further includes the step of connecting the terminal pins 43 to the end faces 11a of the external connecting terminals 11 after the step of cutting the substructure 30 including the wafer 1.

Figure 22:
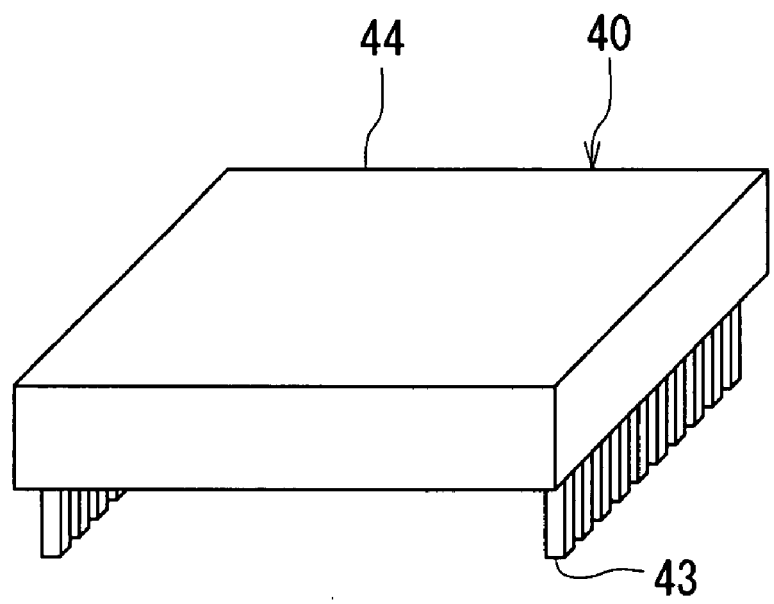
FIG. 22 is a perspective view illustrating still another configuration of the electronic component package of the first embodiment of the invention.

FIG. 22 is a perspective view illustrating still another configuration of the electronic component package 40. In addition to the configuration show in FIG. 21, the electronic component package 40 of FIG. 22 further incorporates a protection layer 44 that covers the connecting portions between the external connecting terminals 11 and the terminal pins 43. The protection layer 44 is made of a resin, for example. The protection layer 44 reinforces the connecting portions between the external connecting terminals 11 and the terminal pins 43.

According to the method of manufacturing an electronic component package of the embodiment as thus described, the wafer 1 is first fabricated. The wafer 1 incorporates: the substrate 10 having the top surface 10a; and the plurality of sets of external connecting terminals 11 that correspond to a plurality of electronic component packages 40 and that are provided on the top surface 10a of the substrate 10. In addition, the wafer 1 includes the plurality of pre-base portions 2 that will be the bases 41 of the respective electronic component packages 40 later by being separated from one another. Then, according to the embodiment, at least one electronic component chip 3 is bonded to each of the pre-base portions 2 of the wafer 1 to fabricate the substructure 30. Next, the substructure 30 including the wafer 1 is cut so that the pre-base portions 2 are separated from one another and the plurality of bases 41 are thereby formed. A plurality of electronic component packages 40 are thus manufactured. As a result, according to the embodiment, it is possible to mass-produce the electronic component packages 40 at low costs in a short period of time.

In the embodiment, in the step of fabricating the wafer 1, the plurality of sets of external connecting terminals 11 are formed on the top surface 10a of the substrate 10 by plating. As a result, according to the embodiment, it is possible to form the plurality of sets of external connecting terminals 11 into minute dimensions with accuracy.

The wafer 1 of the embodiment includes no circuit element. As a result, even if any alteration is required for the specifications of the electronic component packages 40, it is not totally required to make any alteration to the wafer 1, or even if a change in the number and/or arrangement of the external connecting terminals 11 is required, it is easy to make such a change. In the embodiment, in particular, since the plurality of sets of external connecting terminals 11 are formed by plating, it is easy to change the number and/or arrangement of the external connecting terminals 11. In addition, according to the embodiment, it is easy to alter the specifications of the electronic component packages 40 by modifying the chip 3 to be disposed in each of the pre-base portions 2 of the wafer 1. Because of these features of the embodiment, it is possible to flexibly and quickly respond to alterations to the specifications of the electronic component packages 40.

According to the embodiment, a plurality of chips 3 can be disposed in each of the pre-base portions 2 of the wafer 1, and these chips 3 can be connected to one another by the inter-chip connecting portions 22. It is thereby possible to mass-produce the electronic component packages 40 as multi-chip modules at low costs in a short period of time.

In the embodiment, any combination of the plurality of chips 3 is possible in the case in which the plurality of chips 3 are disposed in each of the pre-base portions 2 and these chips 3 are connected to one another. Examples of combination of the plurality of chips 3 to be disposed in each of the pre-base portions 2 include a combination of two or more circuit elements of the same type or different types selected from C-MOS integrated circuit elements, high-speed C-MOS integrated circuit elements, high-withstand C-MOS integrated circuit elements, bipolar integrated circuit elements, high-speed bipolar integrated circuit elements, and high-withstand bipolar integrated circuit elements. Furthermore, a plurality of memory elements such as flash memory, SRAM, DRAM or PROM may be disposed as the plurality of chips 3 in each of the pre-base portions 2. It is thereby possible to manufacture the electronic component packages 40 each of which functions as a memory element having a large storage capacity. Furthermore, a sensor or an actuator formed by using the MEMS and a driver circuit element for driving it may be provided in each of the pre-base portions 2.

In the embodiment, wiring may be formed by using bonding wire or a conductor layer formed on the substrate 10 of the wafer 1 in place of at least either the terminal connecting portions 21 or the inter-chip connecting portions 22 formed by plating. However, higher-density wiring is achievable by using the terminal connecting portions 21 and the inter-chip connecting portions 22 formed by plating, and it is therefore easier to downsize the electronic component packages 40, compared with the case in which wiring is formed by using bonding wire or a conductor layer formed on the substrate 10.

The terminal connecting portions 21 and the inter-chip connecting portions 22 may be formed by soldering instead of plating. In this case, for example, a thin metal plate made of stainless steal, for example, is punched to fabricate a mask having openings formed in regions where the terminal connecting portions 21 and the inter-chip connecting portions 22 are to be formed, the mask is placed on the insulating layer 14 having the openings 14a, and a molten solder is poured into the openings 14a and the openings of the mask. The terminal connecting portions 21 and the inter-chip connecting portions 22 are thereby formed. Through this method, it is easy to form the terminal connecting portions 21 and the inter-chip connecting portions 22.

In the embodiment, the top surface of each of the external connecting terminals 11 is located at the same height or nearly the same height as the top surface of each of the electrodes 3a of the chips 3. As a result, it is possible to easily connect the chips 3 to the external connecting terminals 11 through the terminal connecting portions 21, and to form the terminal connecting portions 21 with accuracy.

In the embodiment, each of the external connecting terminals 11 includes the first plating layer 11A and the second plating layer 11B that are stacked. As a result, according to the embodiment, it is possible to make the thickness of each of the external connecting terminals 11 relatively great. It is thereby possible to increase the area of the end faces 11a of the external connecting terminals 11 exposed at the side surfaces 41a of the base 41. As a result, according to the embodiment, it is possible to enhance the reliability of electrical connection between each of the external connecting terminals 11 and an external circuit.

Second Embodiment

Figure 23:
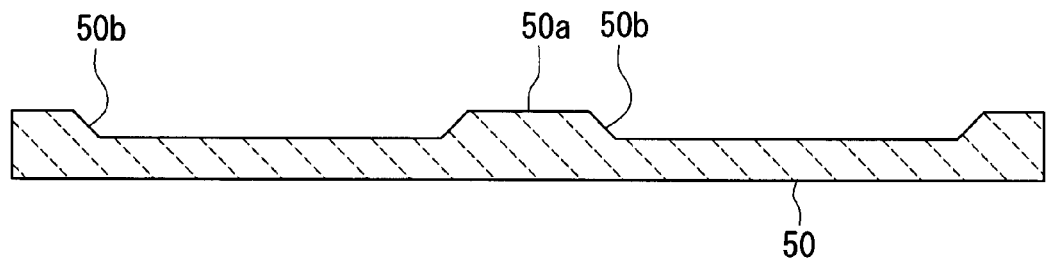
FIG. 23 is a cross-sectional view illustrating part of a substrate of a second embodiment of the invention.

A second embodiment of the invention will now be described. The outline of a method of manufacturing an electronic component package of the second embodiment is similar to the outline of the method of manufacturing an electronic component package of the first embodiment described with reference to FIG. 1 to FIG. 4. In the second embodiment, the step of fabricating the wafer 1 is different from that of the first embodiment, in particular. The method of manufacturing an electronic component package of the second embodiment will now be described in detail with reference to FIG. 23 to FIG. 30. FIG. 23 is a cross-sectional view illustrating part of the substrate of the second embodiment. FIG. 24 to FIG. 29 are cross-sectional views each illustrating part of the stack of layers fabricated in the respective steps of the method of the second embodiment. FIG. 30 is a cross-sectional view illustrating electronic component packages fabricated in a step that follows the step of FIG. 29.

In the method of manufacturing an electronic component package of the second embodiment, a substrate 50 shown in FIG. 23 is first fabricated. The substrate 50 is in the form of a plate having a top surface 50a. The top surface 50a has a plurality of recessed portions 50b in which a plurality of chip bonding conductor layers 12 will be respectively disposed later. For example, the recessed portions 50b can be formed by partially etching the top surface of the substrate 50 which is initially flat. For example, in a case in which the substrate 50 is made of silicon, the recessed portions 50b can be formed by performing wet etching using KOH as an etchant. The recessed portions 50b each have a depth within a range of 30 to 300 μm inclusive, for example.

Figure 24:
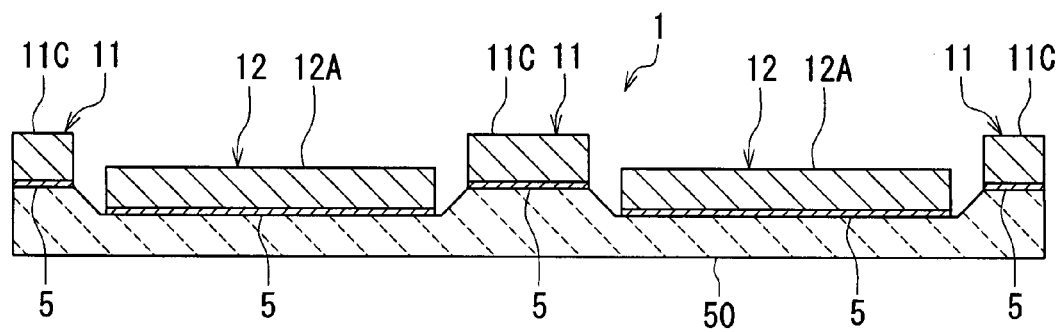
FIG. 24 is a cross-sectional view illustrating a stack of layers fabricated in a step of a method of manufacturing an electronic component package of the second embodiment of the invention.

FIG. 24 illustrates the following step. In this step, first, the seed layer 5 for plating is formed by sputtering, for example, to entirely cover the top surface 50a of the substrate 50. The thickness and material of the seed layer 5 are the same as those of the first embodiment.

Next, on the seed layer 5, a plurality of terminal plating layers 11C that are to constitute a plurality of external connecting terminals 11 and a plurality of chip bonding plating layers 12A that are to constitute a plurality of chip bonding conductor layers 12 are formed by plating such as frame plating. The terminal plating layers 11C are located above portions of the top surface 50a of the substrate 50 other than the recessed portions 50b. The chip bonding plating layers 12A are disposed in the recessed portions 50b. Each of the plating layers 11C and 12A has a thickness within a range of 30 to 500 μm inclusive, for example. The plating layers 11C and 12A can be made of any of Cu, Ni, Fe, Ru and Cr, or an alloy containing any of these, or NiFe or CoNiFe, for example.

Next, the seed layer 5 except portions thereof located below the plating layers 11C and 12A are removed by etching using the plating layers 11C and 12A as masks. As a result, the external connecting terminals 11 are formed of the plating layers 11C and portions of the seed layer 5 remaining below the plating layers 11C. In addition, the chip bonding conductor layers 12 are formed of the chip bonding plating layers 12A and portions of the seed layer 5 remaining therebelow. The wafer 1 is thus fabricated.

A difference in level is created between the top surface of each external connecting terminal 11 and the top surface of each chip bonding conductor layer 12, so that the top surface of each external connecting terminal 11 is located above the top surface of each chip bonding conductor layer 12. It is preferred that this difference in level be equal to or nearly equal to the thickness of the chips 3 that will be disposed on the chip bonding conductor layers 12 later.

Figure 25:
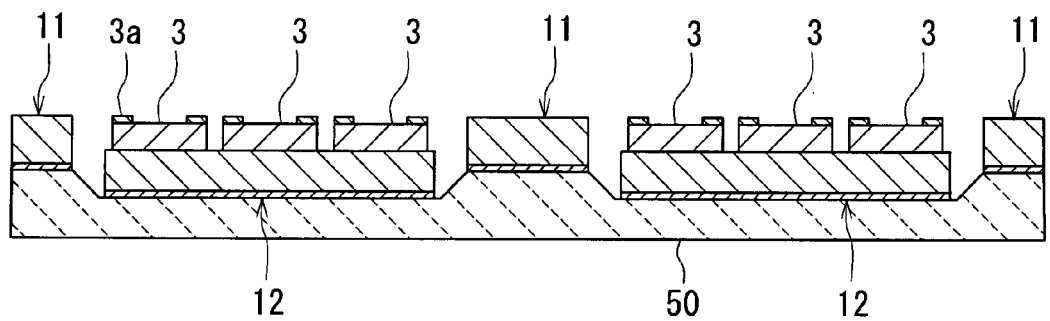
FIG. 25 is a cross-sectional view illustrating part of a stack of layers obtained in a step that follows the step illustrated in FIG. 24.

FIG. 25 illustrates the following step. In this step, at least one chip 3 is bonded to each of the chip bonding conductor layers 12 of each of the pre-base portions 2. Each of the chips 3 has a top surface, a bottom surface, and a plurality of electrodes 3a disposed on the top surface. Each of the chips 3 is disposed such that the bottom surface is bonded to the chip bonding conductor layer 12. The top surface of each electrode 3a is located at the same height or nearly the same height as the top surface of each external connecting terminal 11.

Figure 26:
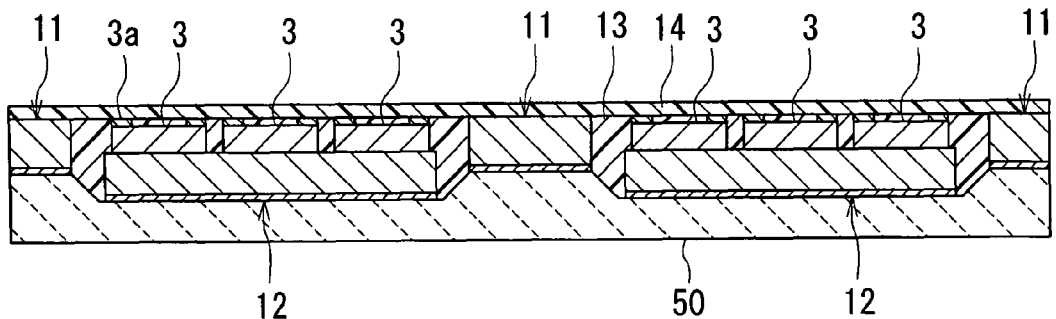
FIG. 26 is a cross-sectional view illustrating part of a stack of layers obtained in a step that follows the step illustrated in FIG. 25.

FIG. 26 illustrates the following step. In this step, the insulating layers 13 and 14 are formed in the manner as described in the first embodiment. The top surface of the insulating layer 14 is flattened.

Figure 27:
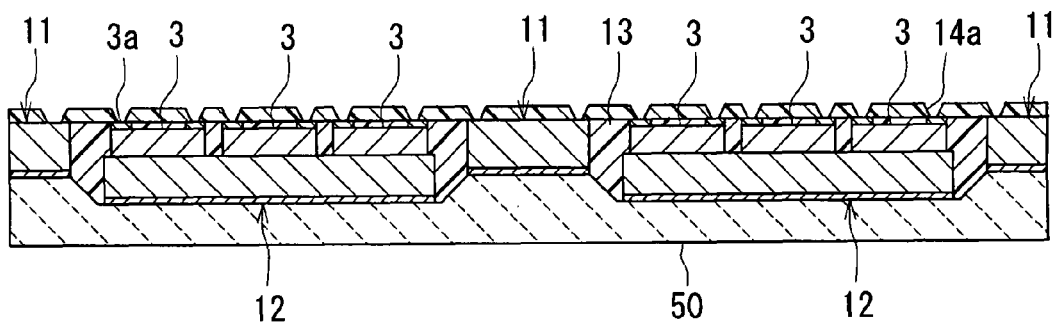
FIG. 27 is a cross-sectional view illustrating part of a stack of layers obtained in a step that follows the step illustrated in FIG. 26.

FIG. 27 illustrates the following step. In this step, in the manner as described in the first embodiment, a plurality of openings (via holes) 14a for exposing the external connecting terminals 11 and the electrodes 3a are formed in the insulating layer 14.

Figure 28:
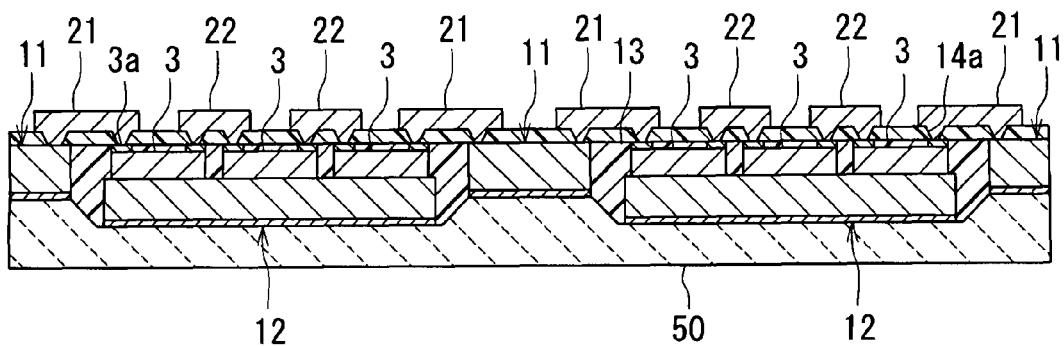
FIG. 28 is a cross-sectional view illustrating part of a stack of layers obtained in a step that follows the step illustrated in FIG. 27.

FIG. 28 illustrates the following step. In this step, in the manner as described in the first embodiment, a plurality of terminal connecting portions 21 and a plurality of inter-chip connecting portions 22 are formed at the same time by plating such as frame plating. When the terminal connecting portions 21 and the inter-chip connecting portions 22 are formed, a connecting portion for connecting different ones of the electrodes of each chip 3 to each other, or a connecting portion for connecting different ones of the external connecting terminals 11 to each other may be formed at the same time.

Figure 29:
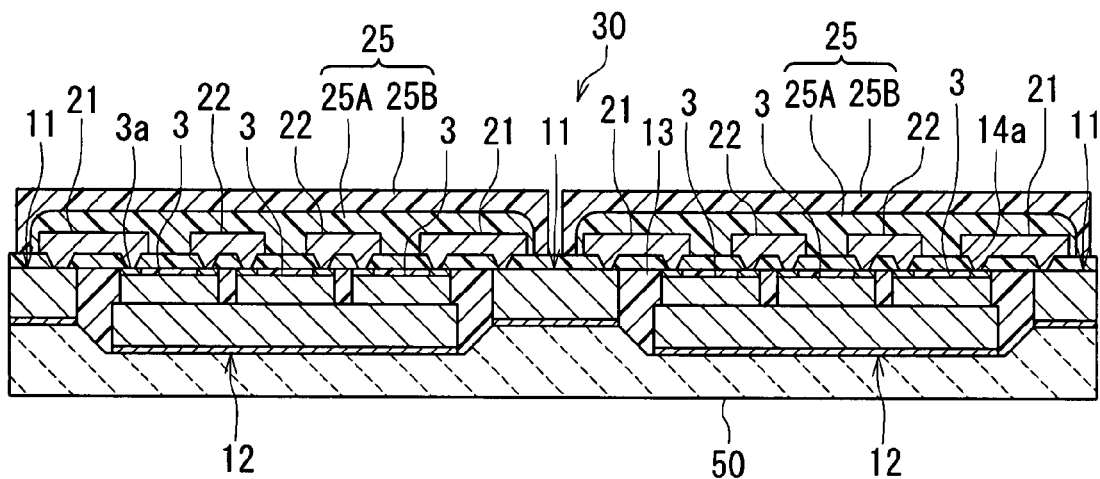
FIG. 29 is a cross-sectional view illustrating part of a stack of layers obtained in a step that follows the step illustrated in FIG. 28.
Figure 30:
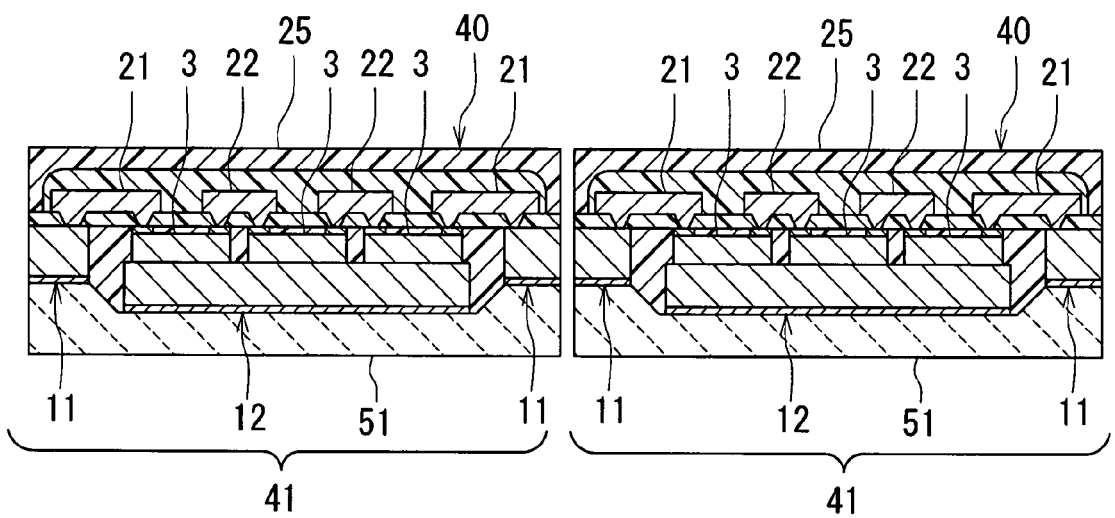
FIG. 30 is a cross-sectional view illustrating electronic component packages fabricated in a step that follows the step illustrated in FIG. 29.

FIG. 29 illustrates the following step. In this step, in the manner as described in the first embodiment, the first sealing layer 25A is formed to cover the terminal connecting portions 21 and the inter-chip connecting portions 22, and then the second sealing layer 25B is formed to cover the first sealing layer 25A. The sealer 25 for sealing the chips 3 is formed of the first sealing layer 25A and the second sealing layer 25B. FIG. 29 illustrates an example in which individual sealers 25 are formed for the respective pre-base portions 2. However, a single sealer 25 may be formed to seal all the chips 3 of all the pre-base portions 2.

The substructure 30 is fabricated in the foregoing manner. The series of the foregoing steps corresponds to the method of manufacturing a substructure for electronic component packages of the embodiment. The substructure 30 incorporates the wafer 1, the plurality of chips 3, the plurality of terminal connecting portions 21, the plurality of inter-chip connecting portions 22, and the plurality of sealers 25.

FIG. 30 illustrates the following step. In this step, the substructure 30 including the wafer 1 is cut so that the pre-base portions 2 are separated from one another and a plurality of bases 41 are thereby formed. As a result, a plurality of electronic component packages 40 each of which incorporates the base 41 and at least one chip 3 are formed. Each base 41 includes a plurality of external connecting terminals 11, one chip bonding conductor layer 12, and a retainer 51 for retaining the terminals 11 and the conductor layer 12. The retainer 51 is formed by cutting the substrate 50. Each electronic component package 40 further incorporates a plurality of terminal connecting portions 21 and the sealer 25. In the case where each electronic component package 40 incorporates a plurality of chips 3, at least one inter-chip connecting portion 22 may be further provided in each electronic component package 40.

The electronic component package 40 of the second embodiment may have the configuration shown in any of FIG. 19 to FIG. 22, as does the electronic component package 40 of the first embodiment.

The remainder of configuration, function and effects of the second embodiment are similar to those of the first embodiment.

The present invention is not limited to the foregoing embodiments but may be practiced in still other ways. For example, the terminal connecting portions 21 may connect a plurality of electrodes 3a of the chip 3 to at least one external connecting terminal 11, or may connect at least one electrode 3a of the chip 3 to a plurality of external connecting terminals 11. The inter-chip connecting portions 22 may connect three or more electrodes 3a of a plurality of chips 3 to one another.

The foregoing embodiments illustrate examples in which the plurality of external connecting terminals 11 are arranged such that the end faces 11a of the external connecting terminals 11 are exposed at two of the four side surfaces 41a of the base 41. In the present invention, however, it is possible that the plurality of external connecting terminals 11 are arranged such that the end faces 11a of the external connecting terminals 11 are exposed at one, three or four of the four side surfaces 41a of the base 41.

Obviously many modifications and variations of the present invention are possible in the light of the above teachings. It is therefore to be understood that within the scope of the appended claims the invention may be practiced otherwise than as specifically described.

What is claimed is:

1. A method of manufacturing an electronic component package, the electronic component package comprising: a base incorporating a plurality of external connecting terminals; and at least one electronic component chip that is bonded to the base and electrically connected to at least one of the external connecting terminals, the method comprising the steps of:

fabricating a wafer, the wafer incorporating: a substrate that has a top surface and does not include the electronic component chip; and a plurality of sets of external connecting terminals that correspond to a plurality of electronic component packages and that are provided on the top surface of the substrate, the wafer including a plurality of pre-base portions that will be separated from one another later so that each of them will thereby become the base;

bonding at least one electronic component chip to each of the pre-base portions of the wafer; and cutting the wafer so that the pre-base portions are separated from one another and a plurality of bases are thereby formed, the step of cutting the wafer being performed after the step of bonding the at least one electronic component chip to each of the pre-base portions, wherein the step of fabricating the wafer includes the step of forming the plurality of sets of external connecting terminals on the top surface of the substrate by plating, and the step of bonding the at least one electronic component chip to each of the pre-base portions of the wafer is performed after the step of forming the plurality of sets of external connecting terminals.

2. The method of manufacturing an electronic component package according to claim 1, wherein the wafer further incorporates a plurality of chip bonding conductor layers to each of which the at least one electronic component chip is to be bonded, the plurality of chip bonding conductor layers being disposed on the top surface of the substrate.

3. The method of manufacturing an electronic component package according to claim 2, wherein the step of forming the plurality of sets of external connecting terminals includes: the step of forming a plurality of first plating layers by plating, the plurality of first plating layers being to become portions of the respective external connecting terminals; and the step of forming a plurality of second plating layers by plating such that the second plating layers are respectively disposed on the first plating layers, and in the step of forming the plurality of first plating layers, a plurality of chip bonding plating layers that are to constitute the plurality of chip bonding conductor layers are formed at the same time.

4. The method of manufacturing an electronic component package according to claim 2, wherein:

the top surface of the substrate has a plurality of recessed portions for the plurality of chip bonding conductor layers to be disposed in; and in the step of forming the plurality of sets of external connecting terminals, the plurality of chip bonding conductor layers are formed at the same time such that the chip bonding conductor layers are disposed in the plurality of recessed portions.

5. The method of manufacturing an electronic component package according to claim 1, wherein the electronic component chip incorporates a plurality of electrodes, and the electronic component package comprises a plurality of terminal connecting portions each of which connects at least one of the electrodes and at least one of the external connecting terminals to each other, the method further comprising the step of forming the terminal connecting portions between the step of bonding the at least one electronic component chip to each of the pre-base portions and the step of cutting the wafer.

6. The method of manufacturing an electronic component package according to claim 5, wherein the step of forming the terminal connecting portions includes the steps of: forming an insulating layer that has a flattened top surface and that covers the wafer and the electronic component chip; forming a plurality of openings in the insulating layer for exposing the external connecting terminals and the electrodes; and forming the terminal connecting portions by plating such that portions thereof are inserted to the openings.

7. The method of manufacturing an electronic component package according to claim 5, wherein:

the electronic component package comprises a plurality of electronic component chips and further comprises at least one inter-chip connecting portion for electrically connecting electrodes of the plurality of electronic component chips to one another; and the inter-chip connecting portion is formed at the same time as the terminal connecting portions are formed.

8. The method of manufacturing an electronic component package according to claim 1, further comprising the step of forming a sealer for sealing the at least one electronic component chip between the step of bonding the at least one electronic component chip to each of the pre-base portions and the step of cutting the wafer.

9. The method of manufacturing an electronic component package according to claim 1, wherein the base has a side surface, and end faces of the plurality of external connecting terminals are exposed at the side surface of the base.

10. The method of manufacturing an electronic component package according to claim 9, wherein
the electronic component package further comprises a plurality of terminal plating films that are disposed on the side surface of the base and respectively connected to the end faces of the external connecting terminals,
the method further comprising the step of forming the plurality of terminal plating films after the step of cutting the wafer.

11. The method of manufacturing an electronic component package according to claim 9, wherein the electronic component package further comprises a plurality of terminal pins respectively connected to the external connecting terminals,
the method further comprising the step of connecting the terminal pins to the end faces of the external connecting terminals after the step of cutting the wafer.

12. A method of manufacturing a wafer for electronic component packages used for manufacturing a plurality of electronic component packages each of which comprises: a base incorporating a plurality of external connecting terminals; and at least one electronic component chip that is bonded to the base and electrically connected to at least one of the external connecting terminals, the wafer incorporating: a substrate that has a top surface and does not include the electronic component chip; and a plurality of sets of external connecting terminals that correspond to the plurality of electronic component packages and that are provided on the top surface of the substrate, the wafer including a plurality of pre-base portions that will be each subjected to bonding of the at least one electronic component chip thereto and will be subjected to separation from one another later so that each of them will thereby become the base,
the method comprising the steps of:
fabricating the substrate; and
forming the plurality of sets of external connecting terminals on the top surface of the substrate by plating.

13. The method of manufacturing a wafer for electronic component packages according to claim 12, wherein the wafer further incorporates a plurality of chip bonding conductor layers to each of which the at least one electronic component chip is to be bonded, the plurality of chip bonding conductor layers being disposed on the top surface of the substrate.

14. The method of manufacturing a wafer for electronic component packages according to claim 13, wherein
the step of forming the plurality of sets of external connecting terminals includes: the step of forming a plurality of first plating layers by plating, the plurality of first plating layers being to become portions of the respective external connecting terminals; and
the step of forming a plurality of second plating layers by plating such that the second plating layers are respectively disposed on the first plating layers, and in the step of forming the plurality of first plating layers, a plurality of chip bonding plating layers that are to constitute the plurality of chip bonding conductor layers are formed at the same time.

15. The method of manufacturing a wafer for electronic component packages according to claim 13, wherein:
the top surface of the substrate has a plurality of recessed portions for the plurality of chip bonding conductor layers to be disposed in; and
in the step of forming the plurality of sets of external connecting terminals, the plurality of chip bonding conductor layers are formed at the same time such that the chip bonding conductor layers are disposed in the plurality of recessed portions.

16. A method of manufacturing a substructure for electronic component packages used for manufacturing a plurality of electronic component packages each of which comprises: a base incorporating a plurality of external connecting terminals; and at least one electronic component chip that is bonded to the base and electrically connected to at least one of the external connecting terminals,
the substructure comprising a wafer and a plurality of electronic component chips, the wafer incorporating: a substrate that has a top surface and does not include the electronic component chip; and a plurality of sets of external connecting terminals that correspond to the plurality of electronic component packages and that are provided on the top surface of the substrate, the wafer including a plurality of pre-base portions that will be separated from one another later so that each of them will thereby become the base, the plurality of electronic component chips being bonded to the plurality of pre-base portions of the wafer,
the method comprising the steps of:
fabricating the wafer; and
bonding at least one electronic component chip to each of the pre-base portions of the wafer,
wherein
the step of fabricating the wafer includes the step of forming the plurality of sets of external connecting terminals on the top surface of the substrate by plating, and
the step of bonding the at least one electronic component chip to each of the pre-base portions of the wafer is performed after the step of forming the plurality of sets of external connecting terminals.

17. The method of manufacturing a substructure for electronic component packages according to claim 16, wherein the wafer further incorporates a plurality of chip bonding conductor layers to each of which the at least one electronic component chip is to be bonded, the plurality of chip bonding conductor layers being disposed on the top surface of the substrate.

18. The method of manufacturing a substructure for electronic component packages according to claim 17, wherein
the step of forming the plurality of sets of external connecting terminals includes: the step of forming a plurality of first plating layers by plating, the plurality of first plating layers being to become portions of the respective external connecting terminals; and the step of forming a plurality of second plating layers by plating such that the second plating layers are respectively disposed on the first plating layers, and
in the step of forming the plurality of first plating layers, a plurality of chip bonding plating layers that are to constitute the plurality of chip bonding conductor layers are formed at the same time.

19. The method of manufacturing a substructure for electronic component packages according to claim 17, wherein:
the top surface of the substrate has a plurality of recessed portions for the plurality of chip bonding conductor layers to be disposed in; and in the step of forming the plurality of sets of external connecting terminals, the plurality of chip bonding conductor layers are formed at the same time such that the chip bonding conductor layers are disposed in the plurality of recessed portions.

20. The method of manufacturing a substructure for electronic component packages according to claim 16, wherein each of the electronic component chips incorporates a plurality of electrodes, and each of the electronic component packages comprises a plurality of terminal connecting portions each of which connects at least one of the electrodes and at least one of the external connecting terminals to each other, the method further comprising the step of forming the terminal connecting portions after the step of bonding at least one electronic component chip to each of the pre-base portions.

21. The method of manufacturing a substructure for electronic component packages according to claim 20, wherein the step of forming the terminal connecting portions includes the steps of: forming an insulating layer that has a flattened top surface and that covers the wafer and the electronic component chips; forming a plurality of openings in the insulating layer for exposing the external connecting terminals and the electrodes; and forming the terminal connecting portions by plating such that portions thereof are inserted to the openings.

22. The method of manufacturing a substructure for electronic component packages according to claim 20, wherein:

each of the electronic component packages comprises a plurality of electronic component chips and further comprises at least one inter-chip connecting portion for electrically connecting the electrodes of the plurality of electronic component chips to one another; and the inter-chip connecting portion is formed at the same time as the terminal connecting portions are formed.

23. The method of manufacturing a substructure for electronic component packages according to claim 16, further comprising the step of forming a sealer for sealing the electronic component chips after the step of bonding at least one electronic component chip to each of the pre-base portions.

* * * * *